(12) United States Patent
Kapoor

(10) Patent No.: US 7,071,734 B2
(45) Date of Patent: Jul. 4, 2006

(54) PROGRAMMABLE LOGIC DEVICES WITH SILICON-GERMANIUM CIRCUITRY AND ASSOCIATED METHODS

(75) Inventor: Ashok K. Kapoor, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 268 days.

(21) Appl. No.: 10/270,928

(22) Filed: Oct. 15, 2002

(65) Prior Publication Data

US 2004/0070421 A1 Apr. 15, 2004

(51) Int. Cl.
*H03R 19/177* (2006.01)

(52) U.S. Cl. .............................. 326/47; 326/41; 326/101
(58) Field of Classification Search .................... 326/9, 326/10, 37–41, 47, 101
See application file for complete search history.

(56) References Cited

U.S. PATENT DOCUMENTS

| 5,585,675 A | 12/1996 | Knopf |
| 5,793,115 A | 8/1998 | Zavracky et al. |
| 6,157,565 A | 12/2000 | Wu et al. |
| 6,337,579 B1 | 1/2002 | Mochida |
| 2001/0006249 A1 | 7/2001 | Fitzgerald |
| 2001/0015450 A1 | 8/2001 | Sugibayashi et al. |
| 2002/0008309 A1 | 1/2002 | Akiyama |
| 2002/0050634 A1 | 5/2002 | Han |

OTHER PUBLICATIONS

Search Report, EP03023559, ALTR:008, Jan. 8, 2004, 5 pgs.
Xu et al., "Experimental Verification Of The Principle Of Operation Of Building Blocks Of 0.6 Volt Si And SiGe Vertical Dual Carrier Field Effect Transistor FPGA With Effective Channel Length Of 5–20nm," IEEE, 2001, pps. 482–485.
Goda et al., "SiGe HBT BiCMOS PFGAs For Fast Reconfigurable Computing," IEE Proc.–Comput. Digit. Tech, vol. 147, No. 3, May 2000, pps. 189–194.
Search Report, EP03023559.2, ALTR:008, Jun. 4, 2004, 8 pgs.

*Primary Examiner*—Anh Q. Tran
(74) *Attorney, Agent, or Firm*—Law Office of Maximillian R. Peterson

(57) ABSTRACT

A programmable logic device (PLD) includes programmable electronic circuitry. The programmable electronic circuitry, fabricated in a silicon substrate, may include a variety of configurable or programmable logic circuitry. The PLD also includes a memory circuitry coupled to the programmable electronic circuitry. The memory circuitry is fabricated using silicon-germanium.

103 Claims, 14 Drawing Sheets

PROGRAMMABLE LOGIC DEVICES WITH SILICON-GERMANIUM CIRCUITRY AND ASSOCIATED METHODS

TECHNICAL FIELD

This patent application relates generally to programmable logic devices (PLDs) and, more particularly, to PLDs that include circuitry fabricated using silicon-germanium (SiGe).

BACKGROUND

A typical PLD uses a memory to program the logic circuitry within the PLD. The memory typically resides on the same silicon die and in the same silicon substrate as do the logic circuitry and other circuitry within the PLD. For a PLD with a relatively large number of programmable elements, the memory may store a large number of bits. Consequently, the memory typically consumes a relatively large and substantial area of the silicon die. For a given die size with a total die area, the area that the memory consumes reduces the area available to the other circuitry within the PLD, such as the logic circuitry. Thus, the overall capacity of the PLD in (terms of equivalent gates or other measure) decreases.

Furthermore, building interconnects between the memory and the logic circuitry typically uses a relatively large number of metal layers, contacts, and a correspondingly substantial number of vias. Fabricating the memory in the same substrate as the logic circuitry leads to using interconnect resources that the logic circuitry would otherwise use, in turn resulting in use of additional interconnect resources. A need therefore exists for PLDs with increased circuit density and efficient use of equivalent gate-count and interconnect resources.

SUMMARY

One aspect of the invention relates to PLDs that include circuitry fabricated using SiGe, or SiGe-based circuitry. In one embodiment, a PLD according to the invention includes programmable electronic circuitry fabricated in a semiconductor substrate (such as a silicon substrate). The PLD also includes memory circuitry coupled to the programmable electronic circuitry. The memory circuitry is fabricated using SiGe.

In another embodiment, a data-processing system according to the invention includes a PLD. The PLD contains programmable logic circuitry configured to allow programming the functionality of the programmable logic device (PLD) in response to programming information. The programmable logic circuitry further configured to reside in a semiconductor substrate (such as a silicon substrate). The PLD also includes a memory circuitry fabricated using silicon-germanium-based circuitry. The memory circuitry provides the programming information to the programmable logic circuitry.

In a third embodiment, a PLD according to the invention includes a first block of circuitry and a second block of circuitry. The first block of circuitry includes programmable logic circuitry. The second block of circuitry is fabricated using silicon-germanium and couples to the first block of circuitry.

The first block of circuitry includes programmable logic circuitry (e.g., look-up tables, configurable logic circuitry, etc.). The second block of circuitry may include memory circuitry used to program the PLD, redundancy circuitry (circuitry that bypasses, removes, or detects defective circuits within the PLD detected during a test procedure) or, generally, any other circuitry not within the data path of the PLD (i.e., any circuitry outside the PLD's data path).

In a fourth embodiment, a PLD according to the invention includes a plurality of programmable logic blocks fabricated in a semiconductor substrate, first and second sets of programmable interconnects, and a plurality of memory elements. The first and second sets of programmable interconnects are disposed in a first dimension and a second dimension within the PLD, respectively. The plurality of memory elements couple to the plurality of programmable logic blocks and to the first and second sets of programmable interconnects. At least one element in the plurality of memory elements is fabricated in at least one layer disposed above the semiconductor substrate.

Another aspect of the invention relates to methods of fabricating PLDs. In one embodiment, a method according to the invention for fabricating a PLD includes producing a programmable electronic circuit in a semiconductor (e.g., silicon) substrate. The method also includes fabricating a memory circuit using silicon-germanium. The memory circuit couples to the programmable electronic circuit.

In another embodiment, a method according to the invention for fabricating a PLD includes fabricating a first block of circuitry within the PLD. The method further includes fabricating a second block of circuitry coupled to the first block of circuitry. The second block of circuitry is fabricated using silicon-germanium.

The first block of circuitry includes programmable logic circuitry (e.g., look-up tables, configurable logic circuitry, etc.). The second block of circuitry may include memory circuitry used to program the PLD, redundancy circuitry (circuitry that bypasses, removes, or detects defective circuits within the PLD detected during a test procedure) or, generally, any circuitry not within the data path of the PLD (i.e., any circuitry outside the data path of the PLD).

DESCRIPTION OF THE DRAWINGS

The appended drawings illustrate only exemplary embodiments of the invention and therefore should not be considered as limiting its scope. The disclosed inventive concepts lend themselves to other equally effective embodiments. In the drawings, the same numeral designators used in more than one drawing denote the same, similar, or equivalent functionality, components, or blocks.

DETAILED DESCRIPTION

This invention contemplates PLDs that include circuitry fabricated using silicon-germanium (SiGe), or SiGe-based circuitry. The SiGe-based circuitry resides above the semiconductor (e.g., silicon) substrate that includes the logic circuitry. More specifically, PLDs according to exemplary embodiments of the invention include SiGe-based circuitry deposited above an insulating layer above the semiconductor substrate where some of the PLD logic circuitry resides.

The SiGe-based circuitry may use one or more layers of SiGe, one or more seed layers of silicon, and one or more layers of insulator or dielectric. One may use the SiGe-based circuitry to implement a memory used to program the PLD, redundancy circuitry (circuitry that bypasses, removes, or detects defective circuits within the PLD detected during a test procedure) or, generally, any other circuitry not within the data path of the PLD. In other words, rather than integrating the memory, redundancy circuitry, or other circuitry within the semiconductor substrate, one integrates such circuitry vertically with respect to the semiconductor substrate, i.e., in the SiGe-based circuitry disposed or fabricated above the semiconductor substrate. Note that memory 106 and redundancy circuitry 115 are merely examples of circuitry that is outside of the data path of the PLD. As noted above, one may generally integrate above the semiconductor substrate of the PLD any circuitry that resides or functions outside the PLD's data path.

The SiGe-based circuitry fabricated in this manner solves the problems associated with conventional PLDs, described above. Use of the SiGe-based circuitry thus results in denser PLDs, with larger equivalent gate counts. Furthermore, the SiGe-based circuitry allows more efficient use of interconnect resources.

Figure 1:
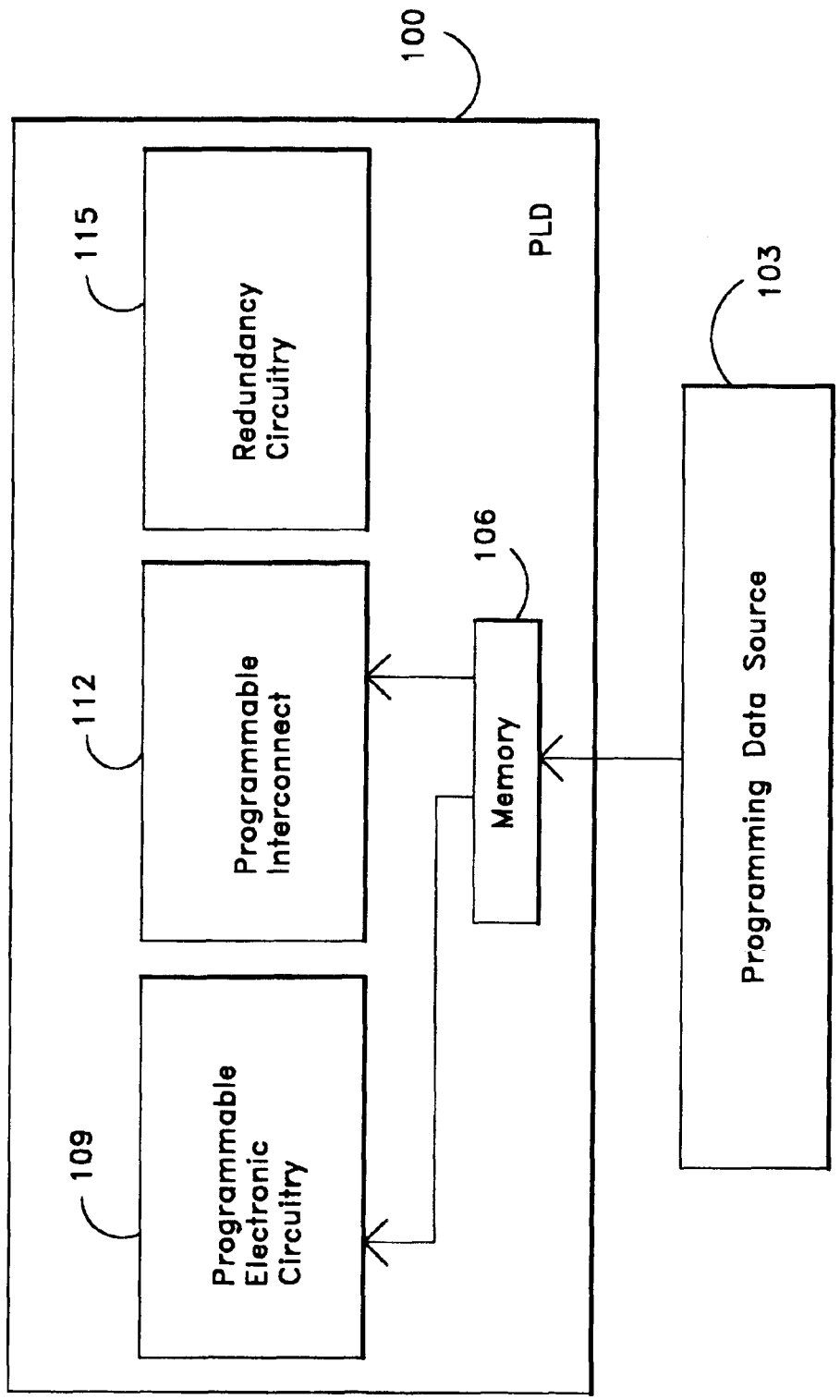
FIG. 1 shows an exemplary embodiment of a circuit arrangement that includes a PLD according to the invention.

FIG. 1 shows an exemplary embodiment of a circuit arrangement according to the invention. The circuit arrangement includes PLD 100 and programming data source 103. PLD 100 includes memory 106, programmable electronic circuitry 109, programmable interconnect 112, and redundancy circuitry 115. Programmable electronic circuitry 109 and programmable interconnect 112 allow one to configure the functionality of PLD 100 (i.e., to program PLD 100), as persons skilled in the art with the benefit of the description of the invention understand.

Programming data source 103 may constitute an appropriate source of data used to program PLD 100. Programming data source 103 supplies data that configure the programmable electronic circuitry 109 via memory 106. Programming data source 103 may include a memory, such as random-access memory (RAM), dynamic RAM (DRAM), magnetic RAM (MRAM), read-only memory (ROM), programmable ROM (PROM), erasable PROM (EPROM), electrically erasable ROM (EEROM), disk, flash memory, and the like, as persons skilled in the art understand.

Programmable electronic circuitry 109 may include a variety of configurable logic circuits, such as look-up-table (LUT) based logic circuits, memory, multiplexers, sequential logic, combinational logic, and the like. In exemplary embodiments, programmable electronic circuitry 109 may include a plurality of programmable logic blocks or circuitry (not shown explicitly). The logic blocks may be arranged as an array or grid (for example, a two-dimensional array of blocks) within PLD 100, as desired.

Programmable interconnect 112 includes configurable coupling structures, for example, multiplexers and/or pass transistors. One may program or control the interconnect resources to provide a desired interconnection among various programmable or configurable circuits with PLD 100, such as other interconnect resources or programmable logic circuitry. In exemplary embodiments, programmable interconnect 112 may include programmable interconnects arranged in two dimensions (e.g., horizontally and vertically, or diagonally, and the like). More specifically, one set of programmable interconnects may be arranged or disposed in a first dimension (e.g., horizontally) of PLD 100, whereas a second set of programmable interconnects may be arranged or disposed in a second dimension of PLD 100 (e.g., vertically), as desired.

Memory 106 couples to programmable electronic circuitry 109 and programmable interconnect 112. Memory 106 uses the programming data to configure the programmable interconnect 112 and programmable electronic circuitry 109 in a manner known in the art. For example, the programming data may configure multiplexers, look-up tables, etc.

In exemplary embodiments according to the invention, memory 106 includes a plurality of static random-access memory (SRAM) elements implemented using SiGe-based circuitry. The SRAM elements provides low stand-by power consumption and fast operation. Note, however, that one may use other types of memory, as desired. For example, one may employ content-addressable memory (CAM). Moreover, memory 106 may have a block or granular structure, as desired. For example, memory 106 may include a memory block that comprises a desired number of memory elements (such as SRAM elements). The choice of the particular memory circuitry used and the architecture and circuit details in memory 106 depends on design and performance considerations, as persons of ordinary skill in the art who have the benefit of the description of the invention understand.

Unlike conventional PLDs, in PLD 100, memory 106 uses SiGe-based circuitry. Furthermore, redundancy circuitry 115 may also include SiGe-based circuitry. Generally, one may implement in SiGe any circuitry within PLD 100 that does not reside within the data path of PLD 100 (i.e., does not affect the processing speed of PLD 100 after one has programmed PLD 100).

Also unlike conventional PLDs, SiGe-based circuitry, such as memory 106 and/or redundancy circuitry 115 resides above the semiconductor substrate within which programmable electronic circuitry 109, other parts of PLD 100 (including possibly some of programmable interconnect 112) reside. Put another way, one vertically integrates the SiGe-based circuitry with respect to the semiconductor substrate by fabricating on or above the semiconductor substrate various layers, such as SiGe layers.

Note that memory 106 may partly or entirely reside above the semiconductor substrate. In other words, one may fabricate one or more memory elements in memory 106 above the semiconductor substrate, as desired. In one exemplary embodiment, some of the memory elements reside in the semiconductor substrate, whereas other memory elements are fabricated above the semiconductor substrate (using at least one layer of dielectric, semiconductor, etc., as described in detail herein). In another embodiment, all of the memory elements are fabricated above the semiconductor substrate.

One may implement programmable electronic circuitry 109, programmable interconnect 112, and various other parts of PLD 100 (with the exception, of course, of those parts implemented using SiGe-based circuitry) using silicon-based technologies. As an example, one may use complementary metal oxide semiconductor (CMOS) or p-type or n-type metal oxide semiconductor (NMOS and PMOS) technologies, as desired. As an alternative to silicon-based schemes, one may use silicon on insulator (SOI) technologies. In either case, one implements programmable electronic circuitry 109, programmable interconnect 112, and various other parts of PLD 100 in the semiconductor substrate of PLD 100.

As noted above, unlike conventional PLDs, in PLD 100, memory 106 does not reside in the same semiconductor substrate (such as a silicon substrate) that includes silicon-based circuitry for PLD 100. Instead, it resides in SiGe layer(s) fabricated above the semiconductor substrate of PLD 100 or, put another way, one integrates memory 106 vertically with respect to the semiconductor substrate of PLD 100.

Figure 2:
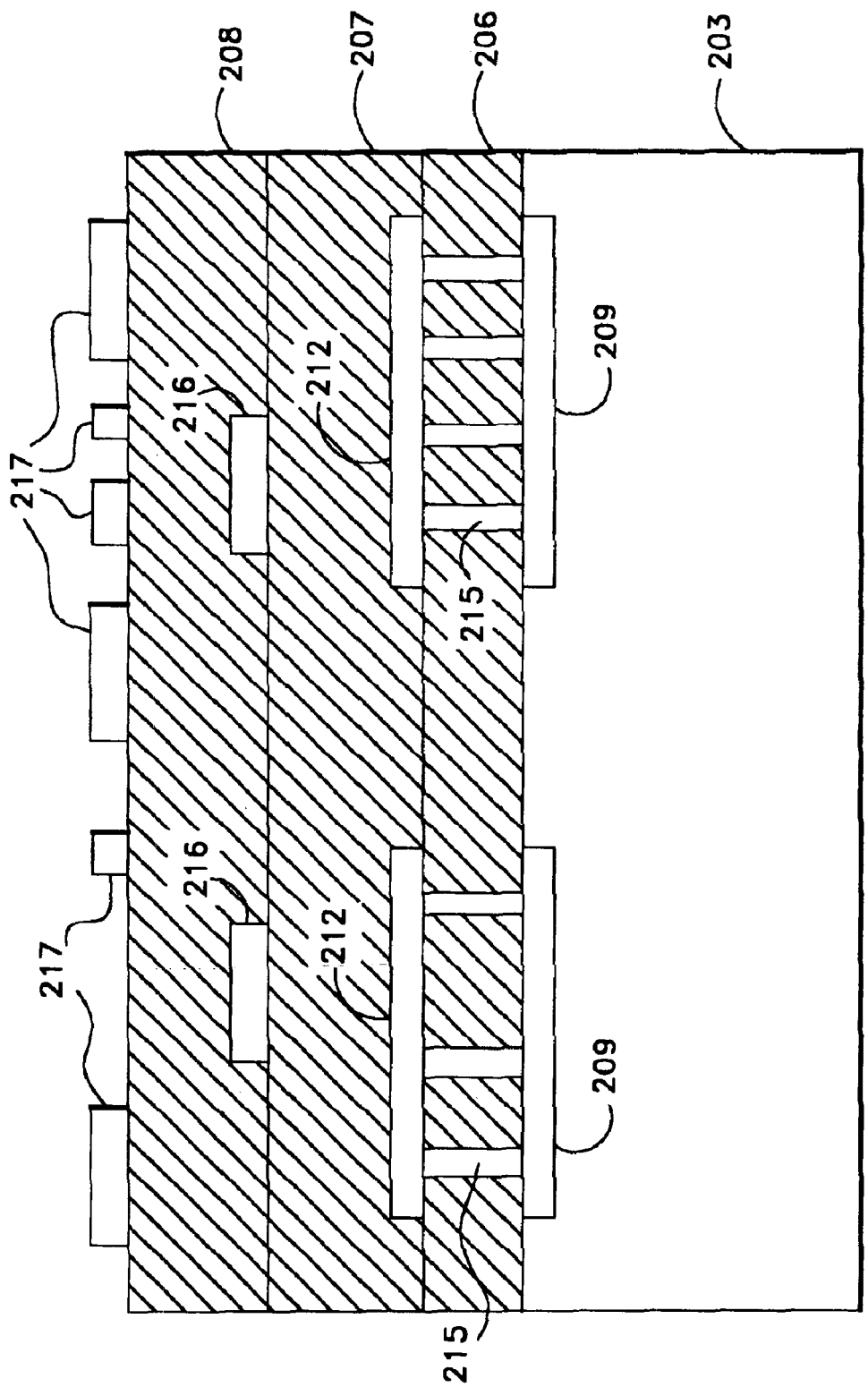
FIG. 2 illustrates a cross-section of a portion of an exemplary embodiment of a PLD wafer fabricated according to the invention.

FIG. 2 depicts a cross-section of a portion of an exemplary embodiment of a PLD wafer fabricated according to the invention that includes SiGe-based circuitry fabricated above the semiconductor substrate of the PLD. The PLD shown in FIG. 2 includes a silicon substrate 203, an oxide layer 206 (combinations of oxide and nitride, or other dielectric or insulator materials, as desired), and SiGe-based circuitry 212. The PLD further includes insulation layer 207, insulation layer 208, interconnect layer 216, and interconnect layer 217.

Silicon substrate 203 includes silicon-based circuitry 209, such as programmable electronic circuitry 109, and possibly some of programmable interconnect 112, etc. Oxide layer 206 resides above silicon substrate 203 and silicon-based circuitry 209. In illustrative embodiments, oxide layer 206 constitutes a low-temperature oxide (LTO) layer. SiGe-based circuitry 212 resides above oxide layer 206. SiGe-based circuitry 212 may include memory 106, redundancy circuitry 115, or other circuitry, as described above. In illustrative embodiments, SiGe-based circuitry 212 constitutes circuitry implemented in polycrystalline SiGe.

A plurality of contacts 215 provide a coupling mechanism between silicon-based circuitry 209 and SiGe-based circuitry 212. Through contacts 215, silicon-based circuitry 209 and SiGe-based circuitry 212 may communicate and provide signals and power to each other. For example, memory 106 implemented in SiGe-based circuitry 212 may configure programmable electronic circuitry 109 implemented in silicon-based circuitry 209 by communicating appropriate programming information to it.

Insulation layer 207 resides above SiGe-based circuitry 212 and oxide layer 206. Interconnect layer 216, disposed above insulation layer 207 includes one or more contacts or coupling mechanisms (e.g., integrated-circuit metal traces). Insulation layer 208 resides above insulation layer 207. Interconnect layer 217 resides above insulation layer 208, and includes one or more contacts or coupling mechanisms (e.g., integrated-circuit metal traces). Insulation layer 207 and insulation layer 208 may constitute LTO, combinations of oxide and nitride, or other insulator or dielectric materials, as desired.

Interconnect layer 216 and interconnect layer 217 are part of the PLD's interconnect resources. They provide coupling mechanisms among the various components or blocks of circuitry within the PLD. The interconnect resources of the PLD may include other elements (not shown explicitly in FIG. 2), such as vias, as persons of ordinary skill in the art with the benefit of the description of the invention understand.

Figure 3:
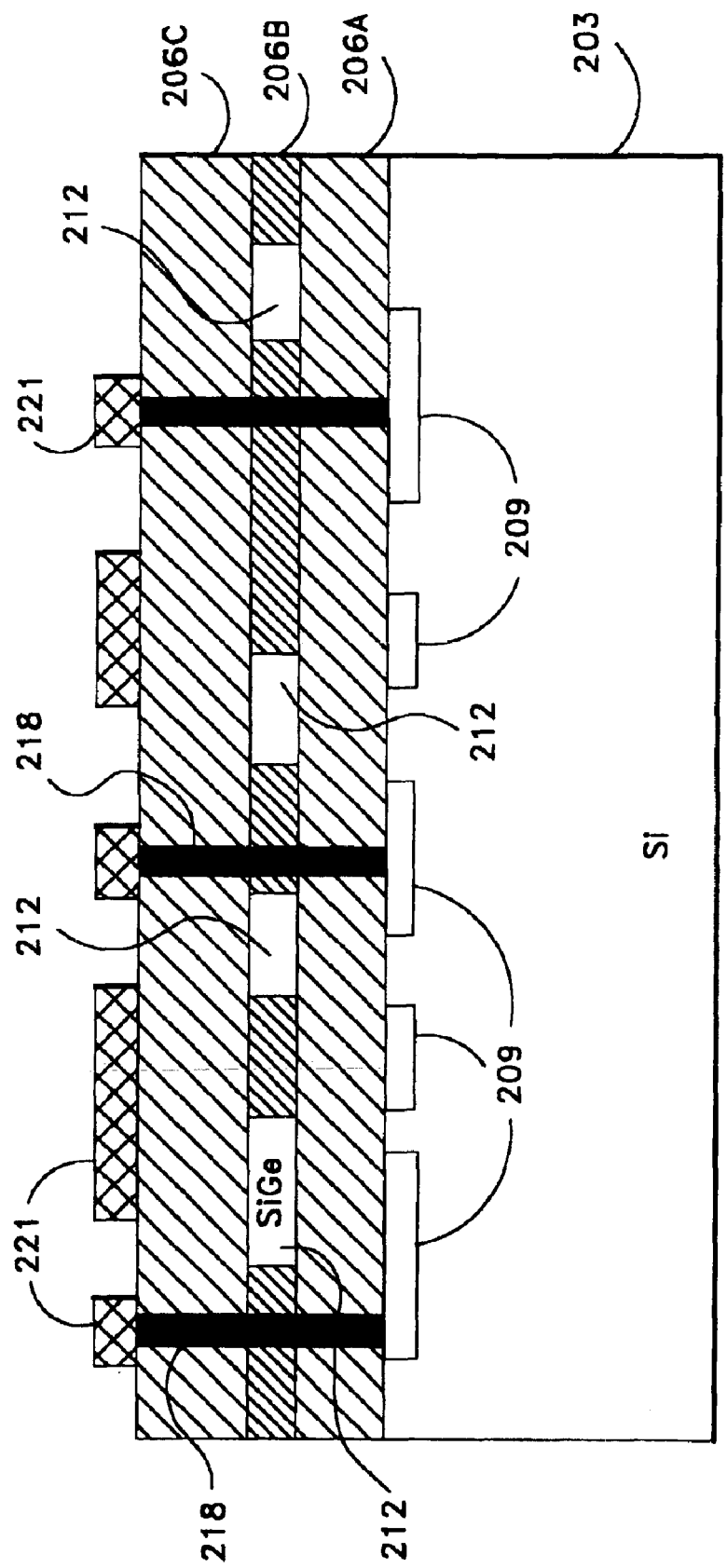
FIG. 3 depicts a cross-section of a portion of another exemplary embodiment of a PLD wafer fabricated according to the invention.

FIG. 3 illustrates a cross-section of a portion of another exemplary embodiment of a PLD wafer according to the invention that includes SiGe-based circuitry fabricated above the semiconductor substrate of the PLD. The PLD shown in FIG. 3 includes a silicon substrate 203, a plurality of oxide (or combinations of oxide and nitride, or other dielectric or insulator materials, as desired) layers or regions 206A–206C, vias 218, and metal layer 221. In illustrative embodiments, oxide layers 206A–206C constitute LTO layers. Note that PLDs according to the invention may include more than one metal layer (or other interconnect layer, such as polysilicon), fabricated using oxide layers or other dielectric layers as insulators, as persons of ordinary skill in the art who have the benefit of the description of the invention understand.

Silicon substrate 203 includes silicon-based circuitry 209, such as programmable electronic circuitry 109, programmable interconnect 112, etc. Oxide layer 206A resides above silicon substrate 203 and silicon-based circuitry 209. Oxide layer 206B resides above oxide layer 206A. SiGe-based circuitry 212 resides within or beneath oxide layer 206B, above oxide layer 206A. SiGe-based circuitry 212 may include memory 106, redundancy circuitry 115, or other circuitry, as described above. In illustrative embodiments, SiGe-based circuitry 212 constitutes circuitry implemented in polycrystalline SiGe. Oxide layer 206C resides above oxide layer 206B. Metal layer 221 in turn resides above oxide layer 206C.

Note that one may fabricate oxide layers 206B and 206C from the same layer of deposited material, as desired, as persons skilled in the art with the benefit of the description of the invention understand. Furthermore, one may fabricate oxide layers 206B and 206C such that they surround SiGe-based circuitry 212, as desired.

A plurality of vias 218 provide a coupling mechanism between metal layer 221 and silicon-based circuitry 209. Through vias 218, silicon-based circuitry 209 may provide signals and power to metal layer 221, and vice-versa. Note that one may also use vias 218 as a coupling mechanism between metal layer 221 and SiGe-based circuitry 212, as desired. Furthermore, as described above in connection with FIG. 2, one may use contacts (not shown explicitly) to provide a coupling mechanism between SiGe-based circuitry 212 and silicon-based circuitry 209, as desired.

FIGS. 4–10 provide more details of illustrative fabrication processes for SiGe-based circuitry in PLDs according to the invention. Beginning with a semiconductor wafer (such as a silicon wafer) or substrate, one first processes the substrate through a conventional semiconductor fabrication process, such as a PMOS, NMOS, or CMOS process. The conventional fabrication process produces silicon-based circuitry 209, as persons of ordinary skill in the art understand.

The semiconductor fabrication process typically includes steps where one forms silicide on the gate polysilicon, and deposits a layer of oxide. One may deposit the layer of oxide using temperatures ranging from about 600° C. to about 800° C., for periods of a few seconds to a few tens of minutes.

The fabrication process typically includes a planarization step of the oxide layer, for example, by chemical-mechanical polishing (CMP). The CMP process produces a substantially planar surface of oxide layer 206. Rather than using a CMP process, one may employ another technique, for example, a conventionally known resist deposit and etch back process, as persons of ordinary skill in the art who have the benefit of the description of the invention understand. Regardless of the particular technique used, the planarization process seeks to produce a nearly planar surface of oxide layer 206 (or other oxide or dielectric layers, as desired).

In exemplary embodiments, one may skip the heat treatment of transistors after the formation of the silicide, as heating during the fabrication of the SiGe performs the function of the heat treatment in conventional processes. Note that, although illustrative embodiments use silicide because of its desirable low resistivity and self-aligning properties, one may use other gate materials (e.g., polysilicon alone or a polycrystalline SiGe layer) and/or processing techniques, as persons skilled in the art with the benefit of the description of the invention understand.

Figure 4:
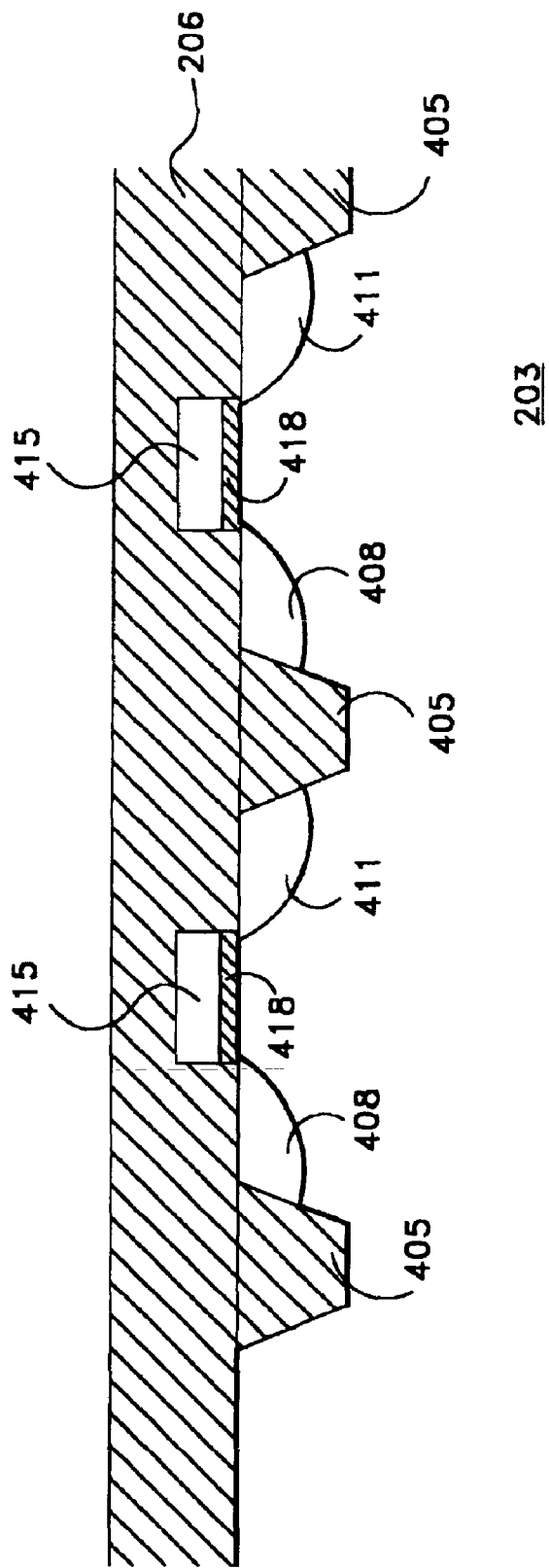
FIG. 4 shows a more detailed cross-section of a portion of an exemplary embodiment of a partially processed PLD wafer processed according to the invention.

FIG. 4 shows a cross-section of a wafer processed according to the invention. FIG. 4 depicts silicon transistors in silicon substrate 203. The silicon transistors include source regions 408, drain regions 411, gates 415, and gate oxide regions 418. Isolation region oxide 405 separate and electrically isolate the silicon transistors from one another. Gates 415 reside beneath or within oxide layer 206. Oxide layer 206 may comprise an LTO region. One may use low-pressure (LP) chemical vapor deposition (CVD) or a plasma-enhanced low-pressure deposition process to fabricate oxide layer 206. As a result of planarization through CMP or a similar process, oxide layer 206 has a substantially planar upper surface.

As noted above, fabrication of the SiGe-based circuitry follows the planarization of the upper surface of oxide layer 206. In illustrative embodiments, SiGe-based circuitry 212 includes thin-film transistors (TFT). Conventional TFT fabrication processes using polysilicon employ relatively high temperatures, e.g., 1000° C. The relatively high temperatures anneal the polysilicon film in the TFT to increase its grain size and to activate the dopants. The annealing process improves the operating electrical parameters (e.g., increased carrier mobility, low leakage) of the resulting transistors. The high temperatures, however, may cause redistribution of semiconductor dopants in the silicon-based circuitry 209 and, generally, in substrate 203.

Figure 5:
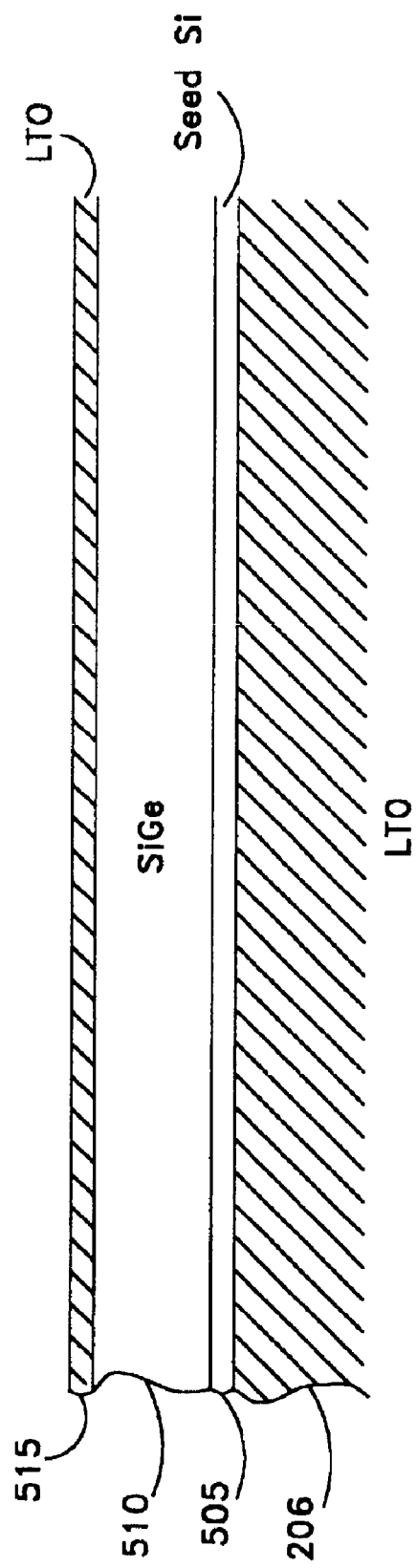
FIG. 5 illustrates another cross-section of a portion of an exemplary embodiment of a PLD wafer further processed according to the invention.

FIG. 5 illustrates a cross-section of a portion of an exemplary embodiment of a PLD wafer further processed according to the invention. Wafer fabrication proceeds with formation of SiGe above the semiconductor substrate. To avoid the dopant distribution problem described above, fabrication processes according to the invention use lower temperatures than conventional processes.

After the deposition of the low-temperature oxide layer 206 and the planarization step, one deposits a relatively thin seed layer of silicon 505 on oxide layer 206. One may deposit seed layer of silicon 505 at temperatures in the range of about 400° C. to about 600° C. and to a thickness in the range of about 10 Å to about 100 Å. A typical process in exemplary embodiments uses a temperature range of about 450° C. to about 550° C. to deposit a layer of about 10 Å to about 50 Å thick. Seed layer of silicon 505 facilitates depositing SiGe layer 510 (SiGe does not tend to deposit directly on silicon-dioxide).

Next, using the same vacuum chamber used to deposit seed layer of silicon 505, one deposits a layer 510 of SiGe on seed layer of silicon 505. One may use temperatures in the range of about 400° C. to about 600° C. to deposit SiGe layer 510, with a thickness in the range of about 0.05μ to about 0.5μ. Depositing a typical SiGe layer 510 in illustrative embodiments uses a temperature range of about 450° C. to about 550° C. to produce a layer about 0.1μ to about 0.3μ thick. The thickness of SiGe layer 510 determines in part the electrical characteristics of the thin-film transistors formed in SiGe layer 510. Making SiGe layer 510 too thick or too thin results in transistors that tend to be hard to control.

One may use LP CVD or sputtering to deposit SiGe layer 510. The deposited SiGe material may have amorphous or polycrystalline form. One may use temperatures in the lower part of the range for LP CVD processes. Generally, one vertically integrates the SiGe-based circuitry with respect to the semiconductor substrate by depositing on the semiconductor substrate various layers of semiconductor fabrication materials, such as semiconductor (e.g., SiGe), insulator or dielectric (e.g., LTO), and interconnect (e.g., metal layer, vias).

As noted above, exemplary embodiments according to the invention use polycrystalline SiGe. Also as noted above, one deposits SiGe layer 510 in the same vacuum chamber used to process seed layer of silicon 505, without breaking the vacuum, in order to avoid the formation of a layer of silicon-oxide on seed layer of silicon 505 (because of exposure to air).

The concentration of germanium (Ge) in SiGe layer 510 affects how low of a temperature one may use to deposit SiGe layer 510. Higher germanium concentrations allow faster increase in the grain size of the deposited film upon annealing, thus facilitating improved control of the electrical parameters of the resulting transistors. The germanium concentration, however, also affects the leakage current of the resulting SiGe transistors. Increasing the germanium concentration lowers the band gap of the material and results in increased current leakage in the final transistors.

Consequently, fabricating SiGe transistors with satisfactory leakage currents but without causing re-distribution of the dopants in the layers beneath entails selecting an appropriate germanium concentration and balancing that concentration with other process parameters. One may control the germanium concentration by controlling the flow of silane ($SiH_4$) and germane ($GeH_4$), two gases used in SiGe fabrication in an LP CVD process.

In exemplary embodiments, fabrication processes according to the invention use germanium concentrations of about 0.1 to about 0.8 (i.e., about 0.1 to about 0.8 units of volume of germanium for each unit of volume of SiGe layer 510). Typically, the germanium concentration ranges from about 0.2 to about 0.6. Note that, depending on the desired transistor characteristics and operating specifications (e.g., leakage current), one may use other germanium concentrations, as persons skilled in the art with the benefit of the description of the invention understand. As noted above, with higher germanium concentrations, one obtains higher rates of deposit and dopant activation, but at the expense of lowering the band gap and increasing the current leakage.

After fabricating SiGe layer 510, one may dope layer 510 with boron or phosphorous, as desired. Doping SiGe layer 510 allows one to change its resistivity to a desired value. A change in the resistivity of SiGe layer 510 modifies the concentration of active carriers in SiGe layer 510. The resistivity of SiGe layer 510 affects the electrical characteristics of circuitry built using SiGe layer 510. Thus, by controlling the resistivity of SiGe layer 510, one may fabricate devices having particular electrical properties, as desired.

To dope SiGe layer 510 in exemplary embodiments, one may use implant doses in the range of about $10^{11}/cm^2$ to about $10^{14}/cm^2$ for both boron and phosphorous. The implant energy depends on the thickness of the desired thickness of the film, and one may adjust it accordingly, as persons skilled in the art with the benefit of the description of the invention understand. Note that, rather than implanting SiGe layer 510, one may implant islands formed in the SiGe layer, as described below in detail.

Next in the fabrication process, one anneals SiGe layer 510. Annealing SiGe layer 510 increases its grain size (i.e., grows the crystal size of the film). One may use an annealing temperature in the range of about 500° C. to about 800° C., and an annealing period of about 30 seconds to about 24 hours.

In an alternative anneal process, one may use a two-step rapid thermal anneal (RTA) process. In the first step, one heats SiGe layer 510 to a temperature of about 550° C. to about 800° C. for about 30 seconds to about 300 seconds. In the second step, one anneals SiGe layer 510 at a temperature of about 500° C. to about 600° C. for about 15 minutes to about 24 hours.

Figure 6:
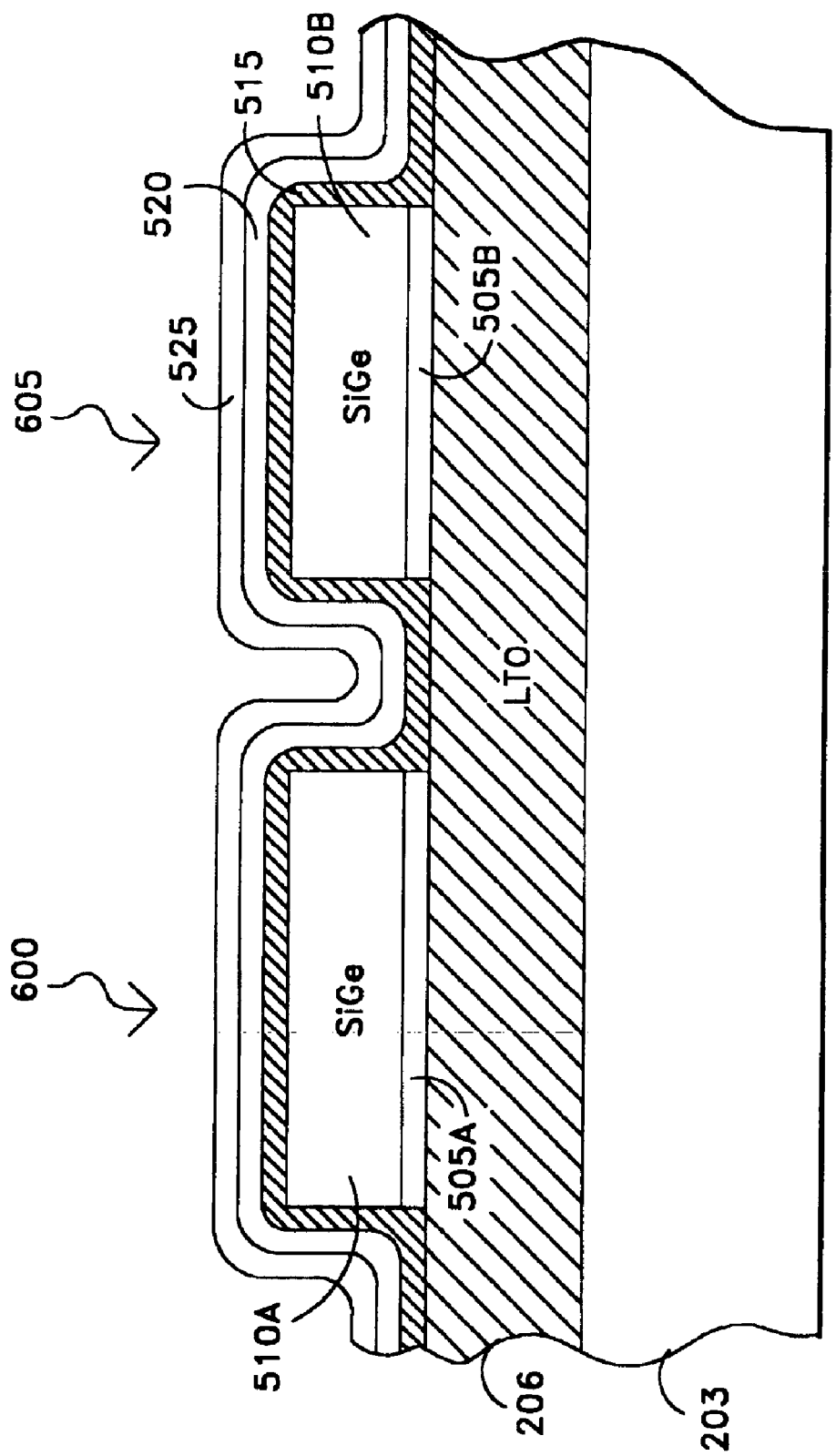
FIG. 6 depicts another cross-section of a portion of an exemplary embodiment of a PLD wafer further processed according to the invention.

After depositing SiGe layer 510, one patterns SiGe layer 510 to define islands that one uses to fabricate SiGe semiconductor devices. FIG. 6 illustrates a cross-section of a portion of a PLD wafer further processed according to the invention to provide islands for device fabrication. The cross-section shows island 600 and island 605.

One may use island 600 to define and fabricate one SiGe device, say, a PMOS SiGe transistor. Similarly, one may use island 605 to define and produce another SiGe device, for example, an NMOS SiGe transistor. As persons of ordinary skill in the art who have the benefit of the description of the invention understand, one may include more islands to fabricate more devices, as desired.

To generate island 600 and island 605, starting with the wafer processed as shown in FIG. 5, one uses standard lithography procedures to define the islands. Then, one uses photoresist layers as etching masks to remove unwanted portions of SiGe layer 510 and leave the desired features, such as etched SiGe layer 510A and etched SiGe layer 510B. One may use plasma etching or other suitable etching technique, as persons skilled in the art with the benefit of the description of the invention understand.

As noted above, rather than implanting SiGe layer 510, one may implant islands 600 and 605 upon the conclusion of the island definition process in order to form MOS transistors. To do so, one uses a photoresist layer to limit the implanted species to reach the desired areas. To form a PMOS transistor in island 600, one dopes the island by ion implanting with phosphorous with a dose ranging from about $10^{11}/cm^2$ to about $10^{14}/cm^2$ and with an implant energy in the range of about 10 keV and about 200 keV.

Similarly, one may use island 605 to form an NMOS transistor. To do so, one does the island with boron using a dose ranging from about $10^{11}/cm^2$ to about $10^{14}/cm^2$ and with an implant energy in the range of about 10 keV and about 200 keV. One may anneal the implanted regions during the anneal process of the transistor source and drain regions, as described below. Alternatively, one may use a separate anneal step to anneal the island body implants for a time period of about 30 seconds to about 24 hours at a temperature of 400° C. to 800° C.

Fabricating MOS transistors involves producing a gate oxide layer for the transistors. Referring to FIG. 6, to form the gate oxide, one fabricates gate oxide layer 515 above etched SiGe layer 510A and etched SiGe layer 510B. One may use LP CVD or a plasma-enhanced deposition process to form oxide layer 515. In exemplary embodiments according to the invention, oxide layer 515 has a thickness of about 10 nm to about 1000 nm. Typically, oxide layer 515 has a thickness of about 17 nm to about 250 nm.

Next, one fabricates the gate material for the MOS transistors. In one embodiment, one may use a SiGe layer as the gate material. To deposit gate SiGe layer 525, one first deposits a relatively thin seed layer of silicon 520 on gate oxide layer 515. One may deposit seed layer of silicon 520 at temperatures in the range of about 400° C. to about 600° C. and to a thickness in the range of about 10 Å to about 100 Å. A typical process in exemplary embodiments according to the invention uses a temperature range of about 450° C. to about 550° C. to deposit a layer of about 10 Å to about 50 Å thick.

Then, one deposits gate SiGe layer 525 on seed layer of silicon 520. In exemplary embodiments, one uses germanium concentrations in the range of about 0.1 to about 0.8, which result in a relatively high rate of deposition and dopant activation (i.e., one may activate the resulting film at relatively low temperatures). Typically, the germanium concentration ranges from about 0.2 to about 0.6. Note that, depending on the desired characteristics of gate SiGe layer 525, one may use other germanium concentrations, as persons skilled in the art with the benefit of the description of the invention understand.

In exemplary embodiments, one may use temperatures in the range of about 400° C. to about 600° C. to deposit gate SiGe layer 525, with a thickness in the range of about 0.1μ to about 0.5μ. A typical gate SiGe layer 735A results from a temperature range of about 450° C. to about 550° C. to deposit a layer about 0.2μ to about 0.4μ thick. One may use LP CVD or sputtering to deposit gate SiGe layer 525. As noted above, the SiGe may have amorphous or polycrystalline form. If one uses temperatures in the lower part of the range, the SiGe deposits in amorphous form. Exemplary embodiments according to the invention use the polycrystalline form, as noted above. As noted above, in order to avoid the formation of an oxide layer, one may deposit gate SiGe layer 525 without breaking vacuum after fabricating seed layer of silicon 520.

At the conclusion of the process described above, island 600 includes etched seed layer of silicon 505A, etched SiGe layer 510A, covered by gate oxide layer 515, seed layer of silicon 520 and gate SiGe layer 525, all fabricated above oxide layer 206. Likewise, island 605 includes etched seed layer of silicon 505B, etched SiGe layer 510B, covered by gate oxide layer 515, seed layer of silicon 520 and gate SiGe layer 525, all fabricated above oxide layer 206. Note that the lithography and etching process isolates island 600 from island 605. Accordingly, one may fabricate electrically isolated SiGe devices in island 600 and island 605, respectively.

In an alternative embodiment, one may employ a polycrystalline silicon layer (not shown in FIG. 6) as the gate material. The polycrystalline silicon layer has a thickness ranging from about 100 nm to about 1000. Typically, the thickness of the polycrystalline silicon layer ranges from about 200 nm to about 500 nm. Note that one may employ an LP CVD process to fabricate the polycrystalline silicon layer to form the gate material of the transistors.

Figure 7:
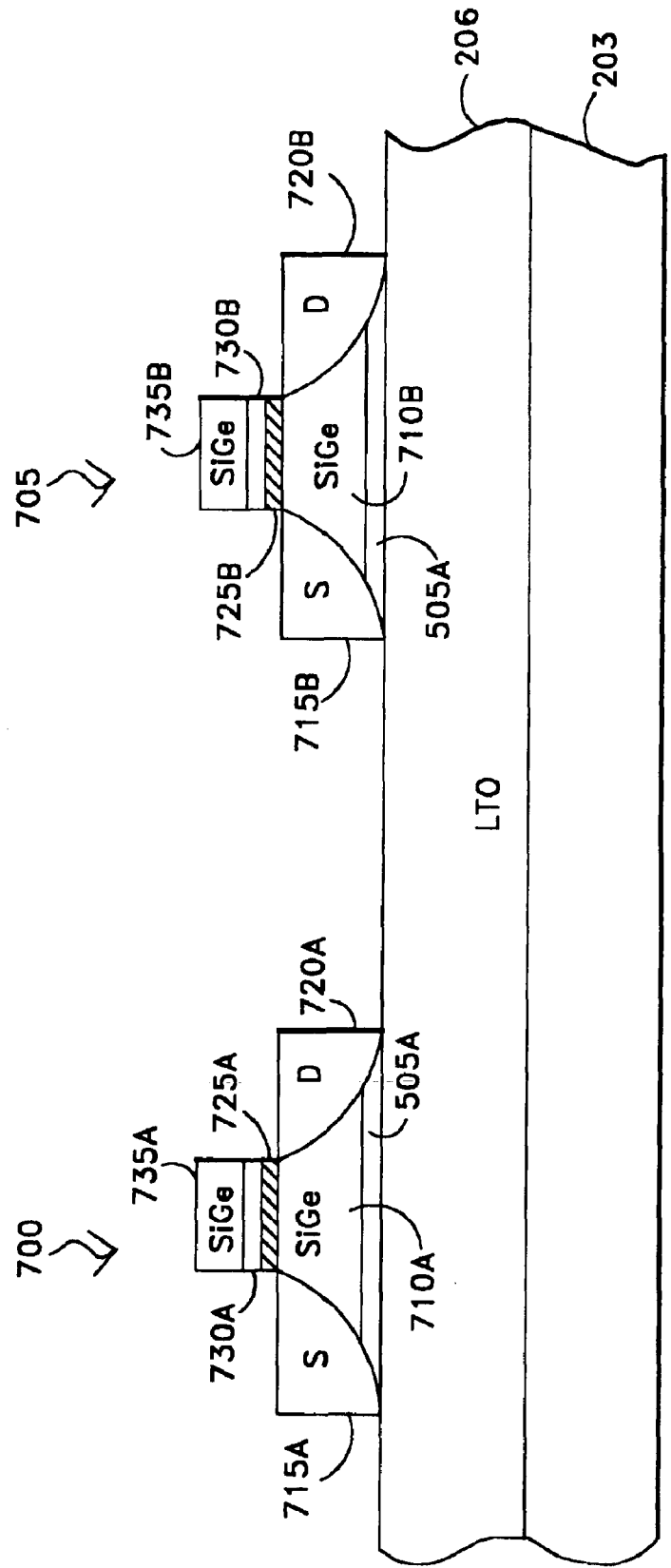
FIG. 7 shows a cross-section of a portion of an exemplary embodiment of a PLD wafer according to the invention, including a PMOS transistor and an NMOS transistor.

FIG. 7 illustrates a cross-section of a portion of a PLD wafer further processed according to the invention to fabricate SiGe devices. To produce the transistors, one selectively removes or etches portions of oxide layer 515, seed layer of silicon 520, and gate SiGe layer 525 (see FIG. 6), as persons skilled in the art with the benefit of the description of the invention understand.

FIG. 7 shows two SiGe transistors: a PMOS transistor 700, and an NMOS transistor 705. The fabrication steps and processes for producing PMOS transistor 700 and NMOS transistor 705 are similar. PMOS transistor 700 includes body region 710A, source region 715A, drain region 720A, fabricated using etched SiGe layer 510 (see FIG. 6). PMOS transistor 700 also includes gate oxide region 725A, fabricated by etching oxide layer 515.

One obtains gate oxide region 725A through lithography and etching of gate oxide layer 515 (see FIG. 6), as noted above. Similarly, one fabricates etched seed of silicon region 730A and gate region 735A by selective lithography and etching of seed layer of silicon 520 and gate SiGe layer 525, respectively. (Note that, in alternative embodiments that use polycrystalline silicon as the gate material, one selectively etches or removes portions of gate oxide layer 515 and the polycrystalline gate layer, as persons skilled in the art with the benefit of the description of the invention understand.)

Thereafter, one implants source region 715A, drain region 725A, and gate region 735A. For PMOS transistor 700, one may use boron as the implanting material. In exemplary embodiments, the implant (boron) may have a dose of about $10^{14}/cm^2$ to about $5 \times 10^{16}/cm^2$, and an implant energy of about 10 keV to about 200 keV. Typically, the implant dose ranges from about $5 \times 10^{14}/cm^2$ to about $5 \times 10^{15}/cm^2$, with an implant energy of about 10 keV to about 100 keV. As noted above, one generally selects the implant energy based on the thickness of the implanted region, as persons of ordinary skill in the art who have the benefit of the description of the invention understand.

Next in the fabrication process, one anneals the implants. One may use an annealing temperature in the range of about 500° C. to about 600° C., and an annealing period of about 30 seconds to about 24 hours. In an alternative anneal process, one uses a two-step rapid thermal anneal (RTA) process. In the first step, one heats the implants to a temperature of about 500° C. to about 600° C. for about 30 seconds to about 300 seconds. In the second step, one anneals the implants at a temperature of about 500° C. to about 600° C. for about 15 minutes to about one hour.

Referring to FIG. 7, NMOS transistor 705 includes body region 710B, source region 715B, drain region 720B, fabricated using etched SiGe layer 510B (see FIG. 6). NMOS transistor 705 also includes gate oxide region 725B, fabricated by selectively etching oxide layer 515. One obtains gate oxide region 725B through lithography and etching of gate oxide layer 515 (see FIG. 6), as noted above.

One may fabricate NMOS transistor 705 in a similar or analogous manner to the fabrication process described above for PMOS transistor 700. One obtains gate oxide region 725B through lithography and etching of gate oxide layer 515 (see FIG. 6), as noted above. Likewise, one fabricates etched seed of silicon region 730B and gate region 735B by selective lithography and etching of seed layer of silicon 520 and gate SiGe layer 525, respectively. (In alternative embodiments that use polycrystalline silicon as the gate material, one selectively etches or removes portions of gate oxide layer 515 and the polycrystalline gate layer, as persons skilled in the art with the benefit of the description of the invention understand.)

Thereafter, one implants source region 715B, drain region 725B, and gate region 535B. For NMOS transistor 705, one may use phosphorous or arsenic as the implanting material. In exemplary embodiments, the implant (phosphorous or arsenic) may have a dose of about $10^{14}/cm^2$ to about $5 \times 10^{16}/cm^2$, and an implant energy of about 10 keV to about 100 keV. Typically, the implant dose ranges from about $1 \times 10^{15}/cm2$ to about $5 \times 10^{15}/cm2$, with an implant energy of about 10 keV to about 100 keV. As stated above, the choice of implant energy depends on the thickness of the implanted region, as persons of ordinary skill in the art who have the benefit of the description of the invention understand.

Assuming that one desires to fabricate only NMOS transistors (rather than both PMOS and NMOS transistors), one next anneals the implants. Similar to PMOS transistor 700, one may use an annealing temperature in the range of about 500° C. to about 600° C., and an annealing period of about 30 seconds to about 24 hours. In an alternative anneal process, one may use a two-step rapid thermal anneal (RTA) process. In the first step of the RTA process, one heats the implants to a temperature of about 500° C. to about 600° C. for about 30 seconds to about 300 seconds. In the second step, one anneals the implants at a temperature of about 500° C. to about 600° C. for about 15 minutes to about one hour. Note that, if one desires to fabricate both PMOS and NMOS transistors on the same wafer, one may perform the annealing of the PMOS and NMOS transistors together, using the annealing procedure described above with respect to PMOS transistors or NMOS transistors.

As described above, the doping of the SiGe material affects its electrical properties, such as its resistivity. By controlling the doping concentration and energy, one may fabricate devices that have particular electrical properties, as desired. The choice of desired electrical and operating characteristics of the devices depends on performance and design specifications for a particular embodiment of the invention. Thus, depending on the desired characteristics of PMOS transistor 700 and/or NMOS transistor 705 for a particular application, one may use other doses, implant energies, or both, as persons skilled in the art with the benefit of the description of the invention understand.

In alternative embodiments according to the invention, rather than using the transistors shown in FIG. 7, one may fabricate lightly doped drain transistors (not shown), as persons skilled in the art with the benefit of the description of the invention understand. In lightly doped drain transistors, one dopes the drain lightly (for example, by using boron for PMOS transistors and phosphorous for NMOS transistors), then deposits another layer of oxide (or oxide and nitride) and performs a selective etch to form spacers. Lightly doped drain transistors counteract the effects of short-channel effect in MOS transistors (e.g., difficulty to control the threshold voltage of the transistor) in small-geometry integrated circuits.

Although FIG. 7 shows one PMOS transistor 700 and one NMOS transistor 705, one may use a variety of other arrangements, as persons of ordinary skill in the art with the benefit of the description of the invention understand. For example, one may fabricate a plurality of PMOS transistors and a plurality of NMOS transistors to implement circuitry using a SiGe CMOS technology. Alternatively, one may fabricate a desired number of PMOS transistors, or a desired number of NMOS transistors, to implement, respectively, SiGe PMOS or SiGe NMOS technologies, as desired.

In SiGe PMOS and NMOS technologies, one may use active pull-down or pull-up devices (e.g., diode-connected transistors) to implement logic circuits, such as an SRAM (used, for example, in memory 106), redundancy circuitry 115, or other logic circuitry, as desired. As an alternative, one may use resistors as pull-down or pull-up components, as desired. For example, one may use resistor-transistor logic (RTL) circuitry to realize general logic circuits, memory 106, and/or redundancy circuitry 115.

Figure 8:
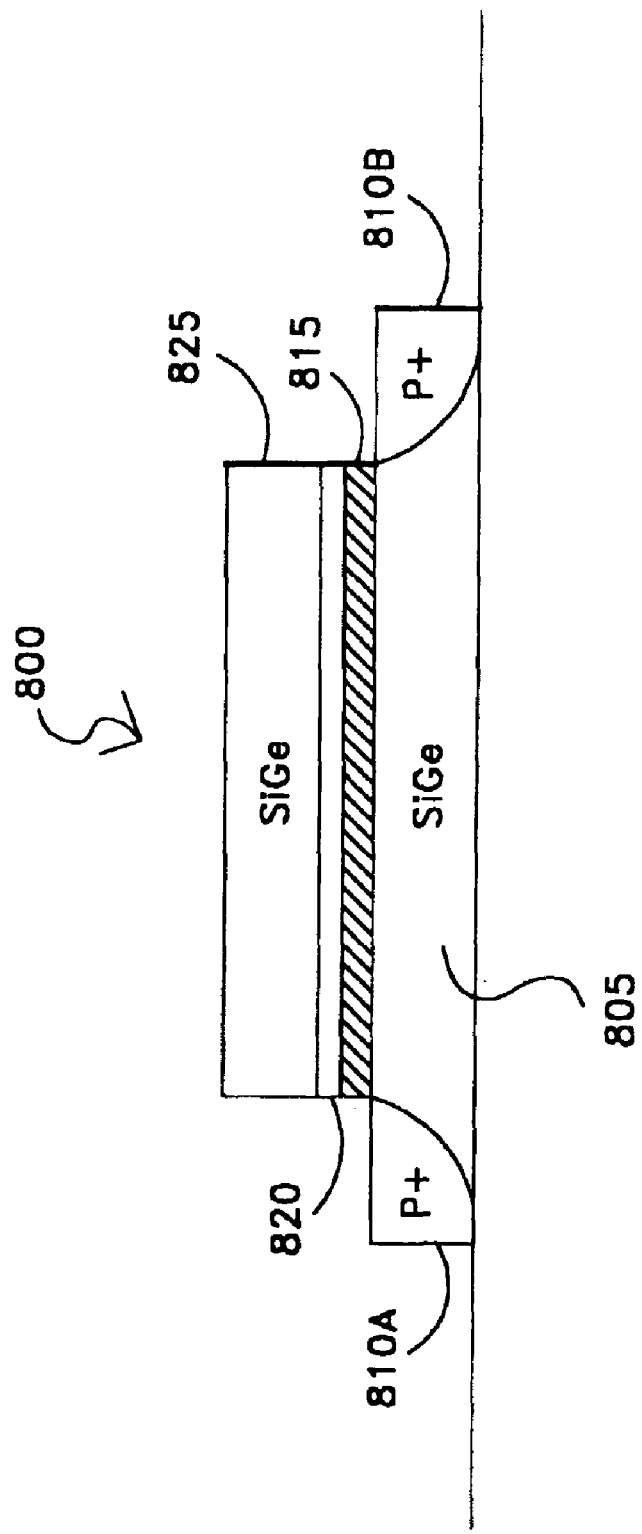
FIG. 8 illustrates a cross-section of a portion of an exemplary embodiment of a PLD wafer that includes a SiGe resistor fabricated according to the invention.

FIG. 8 shows a cross-section of a portion of an exemplary embodiment of a PLD wafer that includes SiGe resistor 800 fabricated according to the invention. To fabricate P-type resistor 800, one processes the wafer as described above. In other words, one fabricates PMOS resistor 800 in the same process as PMOS transistor 700 (see FIG. 7). Thus, one fabricates a structure that includes a SiGe body layer 805, first terminal region 810A, and second terminal region 810B.

Oxide layer 815 (fabricated together with gate oxide layers 725A–725B in FIG. 7) resides above SiGe body layer 805. Seed layer of silicon 820 and SiGe layer 825 (fabricated in the same process as seeds of silicon 730A–730B and gate layers 735A–735B shown in FIG. 7) in turn reside above oxide layer 815.

Note that SiGe layer 825 corresponds to SiGe layers 735A–735B in FIG. 7. Because one seeks to implement a resistor, however, one may leave unused layer 825. SiGe body layer 805 provides an electrical resistance between first terminal region 810A and second terminal region 810B (first terminal region 810A and second terminal region 810B are analogous to the source and drain regions of a MOS transistor, respectively).

One may vary the electrical resistance of resistor 800 in a number of ways, as persons of ordinary skill in the art who have the benefit of the description of the invention understand. For example, one may dope SiGe body layer 805 such that it has a desired resistivity. As another example, one may change the geometry of resistor 800 (e.g., by changing the length, width, or both, of resistor 800), as desired. As yet an alternative, one may vary both the dopant concentration of SiGe body layer 805 and the geometric characteristics of resistor 800, as desired.

Although FIG. 8 shows a P-type SiGe resistor for use in a SiGe PMOS technology, one may implement N-type SiGe resistors also, as desired. In other words, one may use a similar fabrication process to provide N-type SiGe resistors. Generally, PMOS SiGe transistors tend to have superior electrical characteristics to NMOS SiGe transistors, and their fabrication processes use lower temperatures than NMOS fabrication processes. Depending on design and performance specifications, however, one may implement N-type SiGe resistors, as desired.

Figure 9:
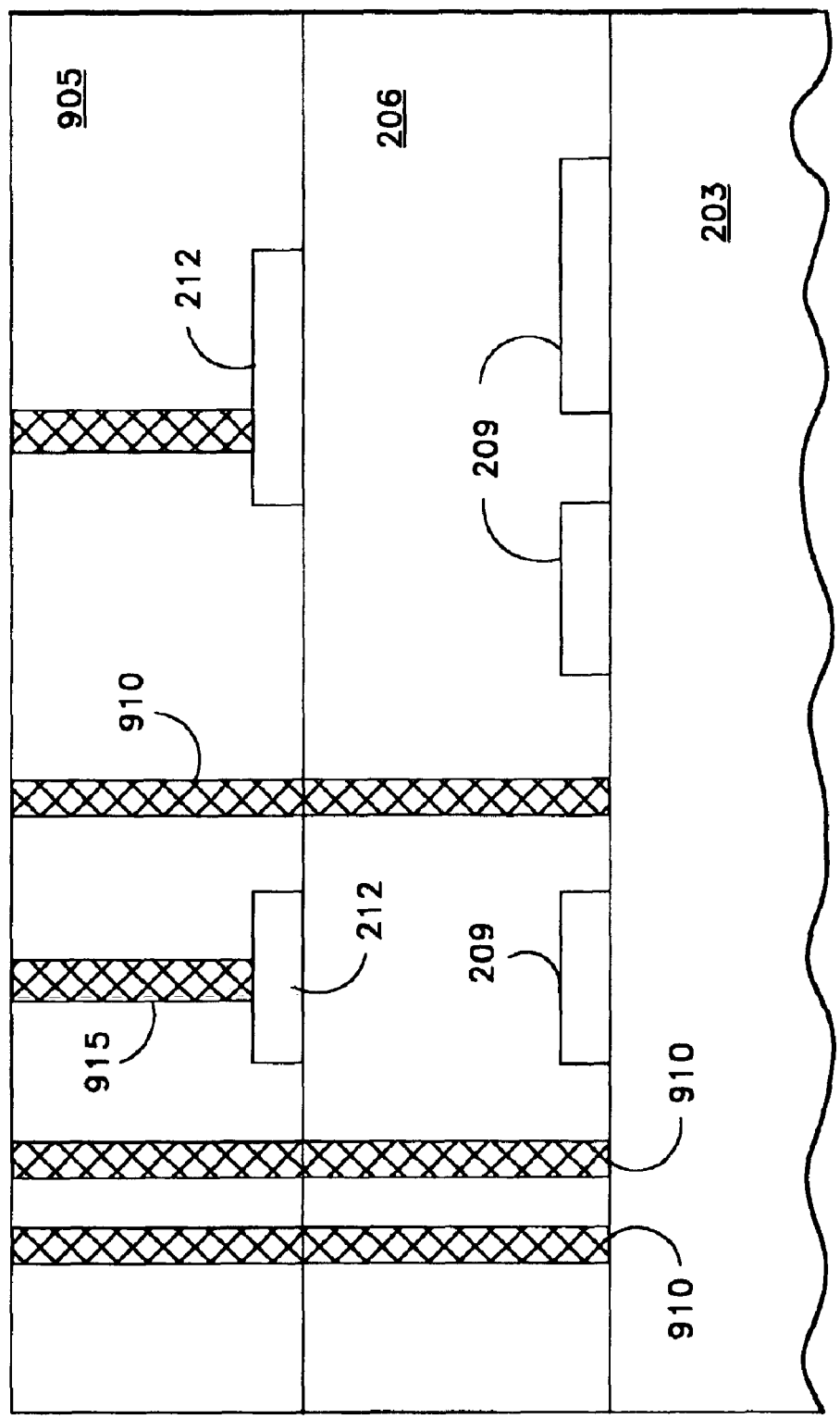
FIG. 9 shows a cross-section of a portion of an exemplary embodiment of a PLD wafer further processed according to the invention that includes contacts.

After completing the fabrication of the SiGe transistors and resistors (if applicable), one covers the SiGe-based circuitry with another layer of oxide. FIG. 9 shows a cross-section of a portion of an exemplary embodiment of a PLD wafer processed according to the invention that includes the additional oxide layer. As noted above, oxide layer 206 resides above silicon-based circuitry 209, and SiGe-based circuitry 212 (e.g., PMOS transistors and resistors, or PMOS and NMOS transistors) resides above oxide layer 206.

To continue fabrication of the wafer, one deposits oxide layer 905 over SiGe-based circuitry 212. In exemplary embodiments of the invention, oxide layer 905 constitutes an LTO layer, and may have a thickness in the range of about 0.2μ to about 4μ. Typically, oxide layer 905 has a thickness of about 0.2μ to about 2μ. One next planarizes oxide layer 905 so that the top surface of it is substantially planar. As noted above, one may use a CMP process or other process to perform the planarization.

Subsequently, one uses a contact mask to fabricate contacts. Some contacts, shown as contacts 915 in FIG. 9, may provide a coupling mechanism between the top surface of oxide layer 905 and SiGe-based circuitry 212. Contacts 915 may provide a coupling mechanism between a set of conductors formed in a metal layer (not shown explicitly) fabricated above oxide layer 905. Other contacts, shown as contacts 910, may provide coupling between the top surface of oxide layer 905 and silicon-based circuitry 209. Contacts 910 may provide a coupling mechanism (e.g., low-resistance electrical connection) between a set of conductors formed in the metal layer (not shown explicitly) fabricated above oxide layer 905. Using contacts 910, one may communicate signals and power buses with silicon-based circuitry 209.

Similarly, using contacts 915, one may communicate signals and power buses with SiGe-based circuitry 212. As persons skilled in the art with the benefit of the description of the invention understand, one may subsequently use metal or conductor deposits to couple contacts 910 to one another, to contacts 915, to power sources, or the like, as desired.

Figure 10:
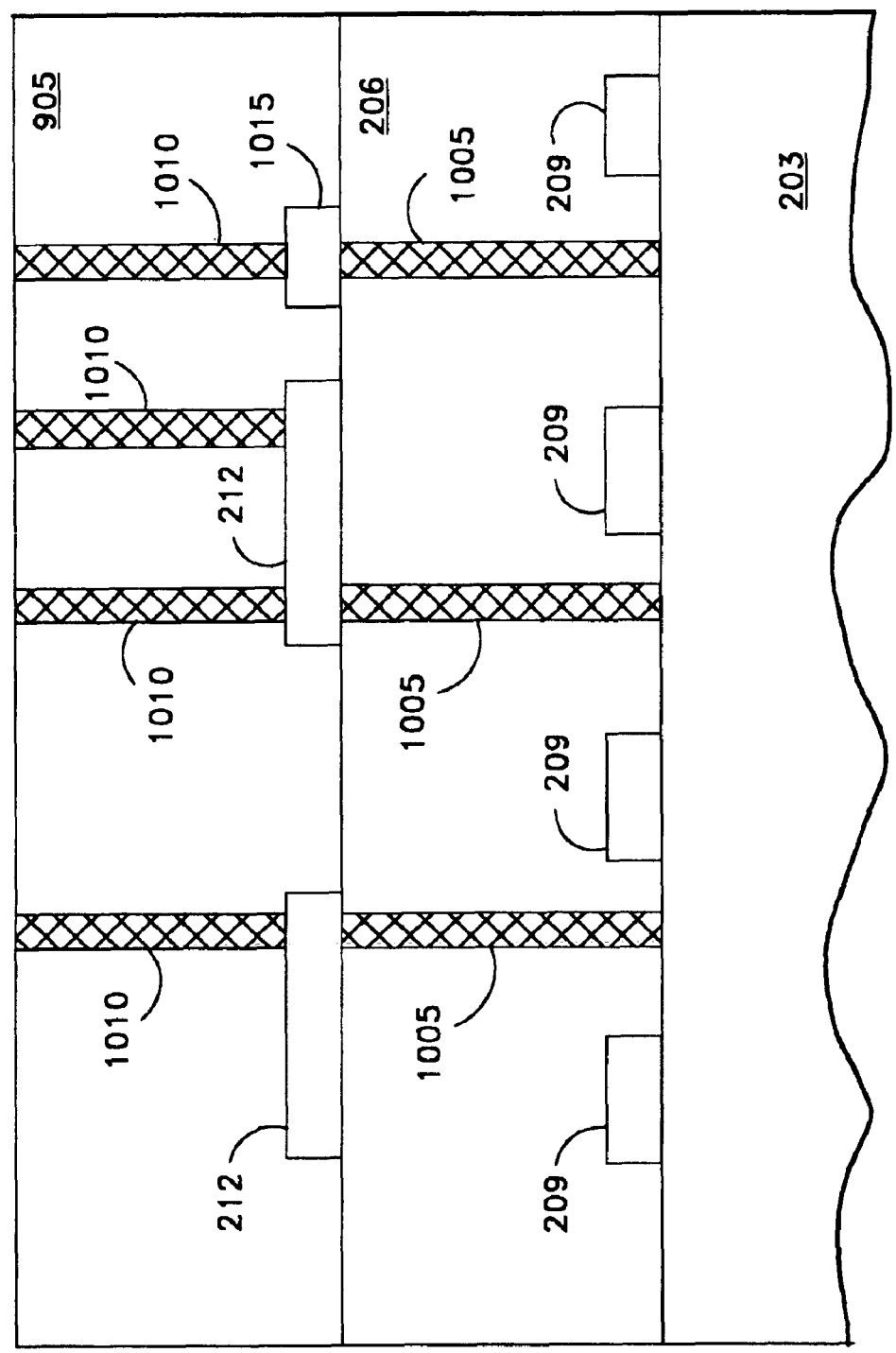
FIG. 10 illustrates a cross-section of a portion of an alternative embodiment of a PLD wafer further processed according to the invention that includes contacts.

In alternative embodiments, one may fabricate contact holes before fabricating SiGe-based circuitry 212. FIG. 10 illustrates a cross-section of an exemplary embodiment of another PLD wafer fabricated according to the invention that includes such contact holes. In this embodiment, one provides contacts, shown as contacts 1005 in FIG. 10, between silicon-based circuitry 209 and the top surface of oxide layer 206 before one fabricates SiGe-based circuitry 212.

Note that one selects the materials used for filling contact 1005 so that it is stable (e.g., does not melt) during the thermal processing of SiGe-based circuitry 212. Examples of such materials include titanium nitride and tungsten. Furthermore, one may employ refractory materials, such as nitrides of tantalum, or other transition metals. One may use other refractory materials such as silicides of tungsten, titanium, molybdenum, etc., for filling contacts 1005 in layer 206. Using such materials obviates employing aluminum or copper for filling contacts in dielectric layer 206, as those metals may melt during processing and fabrication steps.

Once fabrication of oxide layer 206 has completed (including the CMP process to planarize oxide layer 206, as described above), one opens contact holes for contacts 1005. One next fills the holes for contacts 1005 using a multi-step deposition process that employs titanium nitride and tungsten. Furthermore, one may cap contacts 1005 with titanium nitride (not shown explicitly in FIG. 10), as desired. Subsequently, one exposes the top of contacts 1005 by etching back any remaining insulator to provide a substantially flat or planar surface, ready for fabricating SiGe-based circuitry 212. These processing steps fall within the knowledge of persons of ordinary skill in the art who have the benefit of the description of the invention.

Next, one fabricates SiGe-based circuitry 212, as described above in detail. Note that SiGe-based circuitry 212 makes contact with selectively placed contacts 1005. In other words, by selectively placing contacts 1005 in desired locations, one provides a coupling mechanism between SiGe-based circuitry 212 and silicon-based circuitry 209. The alignment between contacts 1005 and SiGe-based circuitry 212 thus occurs naturally during the fabrication process.

Note that, using this scheme as shown in FIG. 10, one makes the contact to the device(s) in layer 212 from the bottom. The electrical terminals of the device(s) fabricated in layer 212 extend to the bottom of layer 212. Such electrical terminals include the source and drain terminals of any NMOS and PMOS transistors and the terminals of any resistors built in layer 212.

While fabricating SiGe-based circuitry 212, one provides buried contacts (not shown explicitly in FIG. 10) at desired locations. The locations of the buried contacts correspond to locations of contacts 1010. After fabricating SiGe-based circuitry 212, one deposits oxide layer 905 over SiGe-based circuitry 212. Oxide layer 905 constitutes an LTO layer and, in exemplary embodiments according to the invention, it may have a thickness in the range of about $0.2\mu$ to about $4\mu$. Typically, oxide layer 905 has a thickness of about $0.2\mu$ to about $2\mu$. One next planarizes oxide layer 905 so that the top surface of it is substantially planar, using a process such as CMP, as noted above.

Subsequently, one uses a contact mask to fabricate contacts 1010. Contacts 1010 provide a coupling mechanism between the top surface of oxide layer 905 and buried contacts (not shown explicitly) placed during fabrication of SiGe-based circuitry 212. Thus, contacts 1010 provide a coupling mechanism between the top surface of oxide layer 905 and SiGe-based circuitry 212. Note that contacts 1010 may couple to conductors formed in a metal layer (not shown explicitly) fabricated above oxide layer 905, as desired.

Note that, using contacts 1005 in conjunction with contacts 1010, one may provide a coupling mechanism between the top surface of oxide layer 905 and silicon-based circuitry 209. As an alternative, one may use one or more of island 1015 to provide coupling between the top surface of oxide layer 905 and silicon-based circuitry 209. More specifically, during fabrication of SiGe-based circuitry 212, one places islands 1015 (together with buried contacts) at locations where one desires to provide a coupling mechanism to silicon-based circuitry 209. Then, after fabrication and planarization of oxide layer 905, one provides contacts 1010 from the top surface of oxide layer 905 to islands 1015.

Using contacts 1005 and contacts 1010 (whether via SiGe-based circuitry 212 or islands 1015), one may communicate signals and power buses with silicon-based circuitry 209. Similarly, using contacts 1010, one may communicate signals and power buses with SiGe-based circuitry 212. As persons skilled in the art with the benefit of the description of the invention understand, one may subsequently use metal or conductor deposits to couple contacts 1010 to one another, to power sources, or the like, as desired.

Typically, SiGe-based circuitry 212 (e.g., memory 106 or redundancy circuitry 115) operates from a different supply voltage than does silicon-based circuitry 209. For example, SiGe-based circuitry 212 may operate from a 10V supply, whereas silicon-based circuitry 209 may use a 2.5V supply voltage. The PLD may receive the supply voltage for SiGe-based circuitry 212 from an external source.

Alternatively, it may generate the supply voltage for SiGe-based circuitry 212 on-chip by using appropriate circuitry, such as a charge pump, as persons skilled in the art with the benefit of the description of the invention understand. One aspect of the invention relates to circuitry for properly coupling SiGe-based circuitry 212 to silicon-based circuitry 209 (e.g., programmable electronic circuitry 109) so as to take into account their differing supply and input and output voltages.

Figure 11:
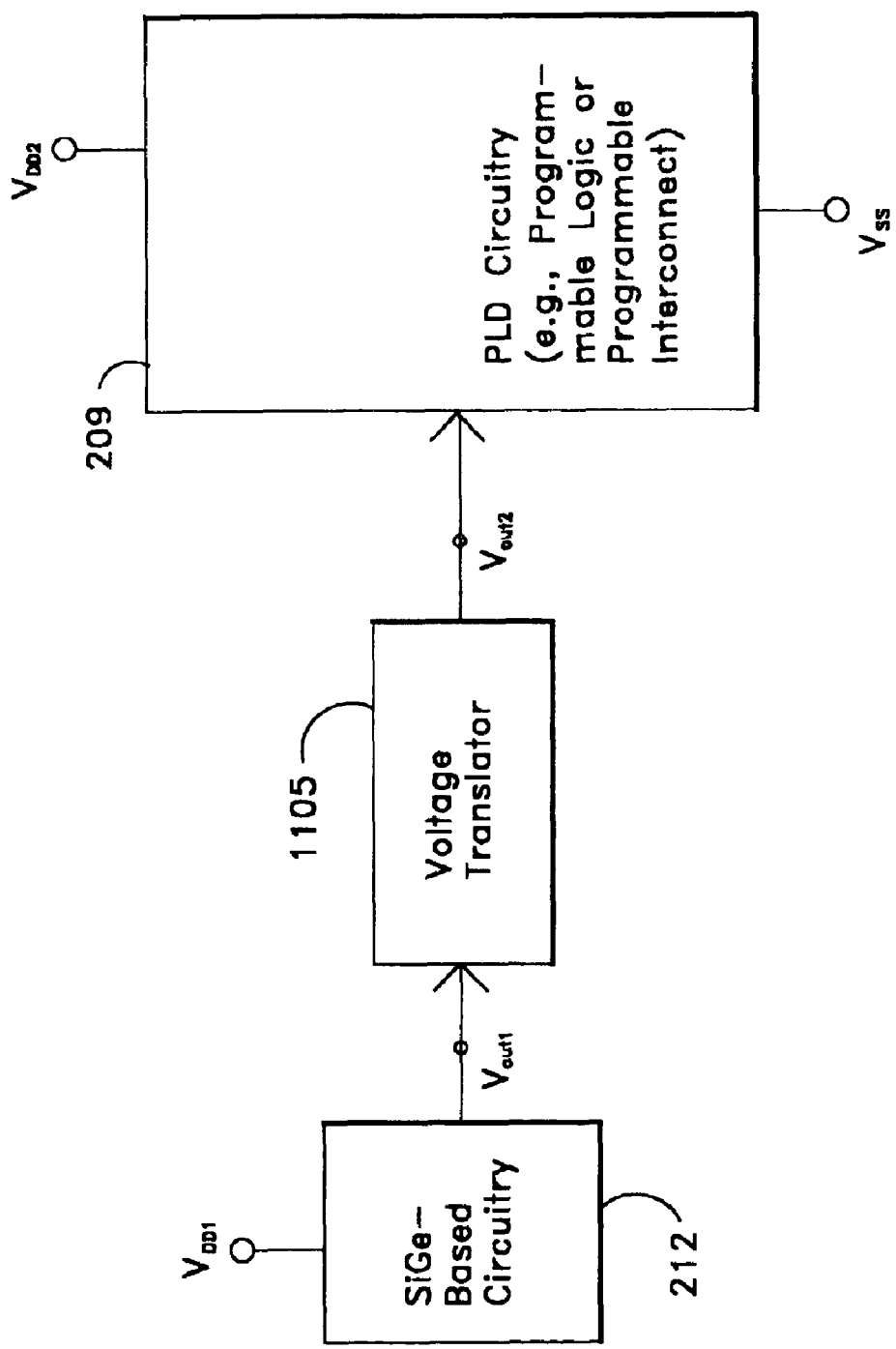
FIG. 11 illustrates a block diagram of a circuit arrangement in an exemplary embodiment of a PLD according that includes a voltage translator.

FIG. 11 shows a circuit arrangement in an exemplary embodiment of a PLD according to the invention that includes a voltage translator 1105. Voltage translator 1105 couples to SiGe-based circuitry 212 and silicon-based circuitry 209. SiGe-based circuitry 212 operates from supply voltage $V_{DD1}$, and provides voltage $V_{out1}$ to voltage translator 1105. Silicon-based circuitry operates from supply voltage $V_{DD2}$, and accepts voltage $V_{out2}$ from voltage translator 1105. Voltage translator 1105 converts or translates voltage $V_{out1}$ to voltage $V_{out2}$. Put another way, voltage translator 1105 acts as a level-shifting circuit. Note that voltage $V_{out2}$ may be the same as, or different from, voltage $V_{DD2}$.

Figure 12:
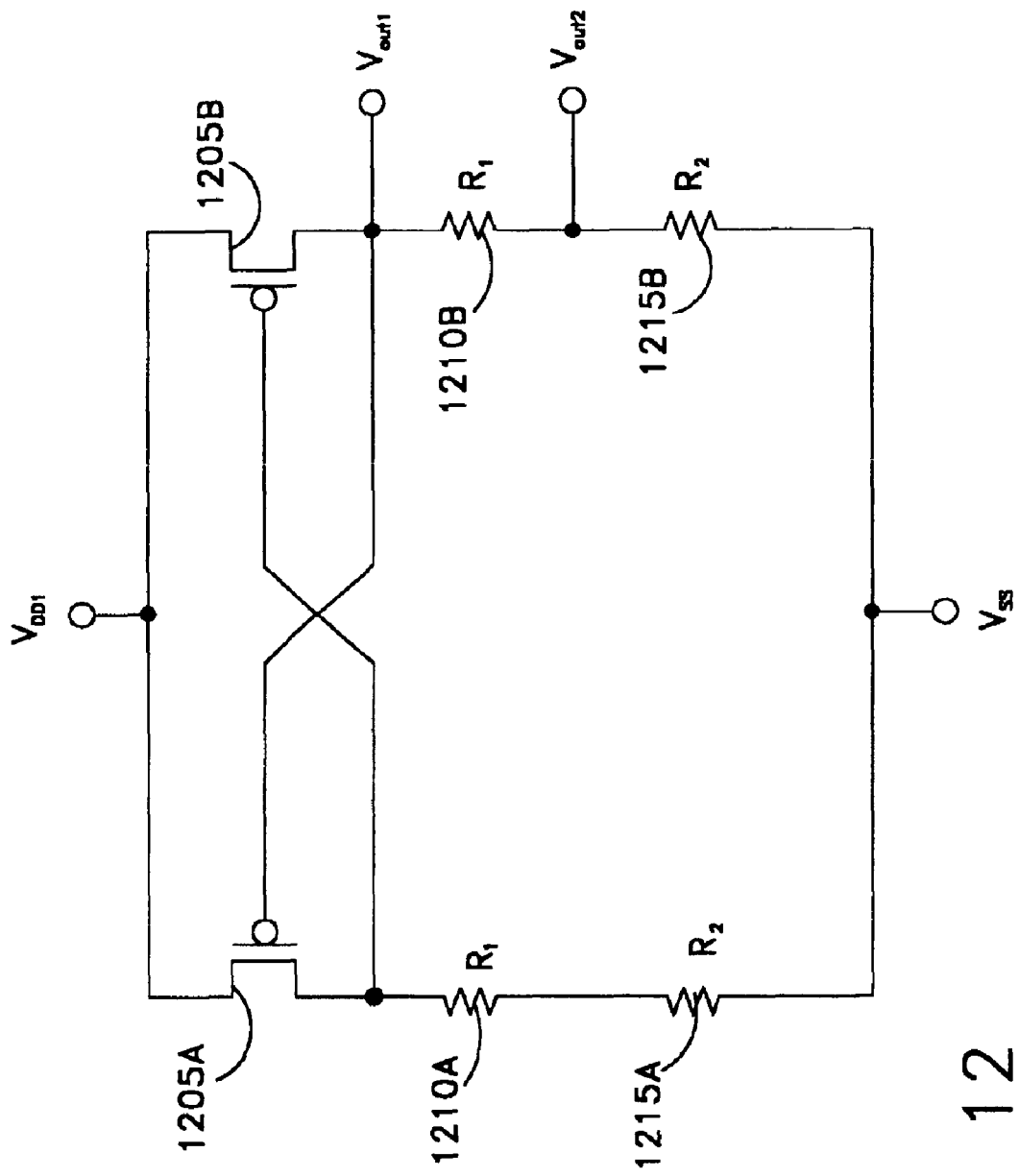
FIG. 12 depicts a portion of an exemplary embodiment of a PLD according to the invention that includes voltage translation or level-shifting.

FIG. 12 depicts a portion of an exemplary embodiment of a PLD according to the invention that includes voltage translation or level-shifting. The circuit in FIG. 12 corresponds to a SiGe-based memory cell, for example, a cell in memory 106 (see FIG. 1). The memory cell constitutes a static memory cell, and includes SiGe PMOS transistor 1205A and SiGe PMOS transistor 1205B, cross-coupled to each other to provide the memory function.

Resistors 1210A–1210B (each with a resistance value of $R_1$) and resistors 1215A–1215B (each with a resistance value of $R_2$) serve two functions. First, they act as pull-down resistors for the memory cell. Second, they provide a voltage translation function that translates voltage $V_{out1}$ to voltage $V_{out2}$. Resistor 1210A and resistor 1215A couple in series with transistor 1205A. Resistor 1210A and resistor 1215A thus act as a voltage divider. Similarly, resistor 1210B and resistor 1215B couple in series with transistor 1205B. Resistor 1210B and resistor 1215B therefore form a voltage divider.

When transistor 1205B is in the OFF state, voltage $V_{out1}$ appears at the drain of transistor 1205. Voltage $V_{out1}$ is substantially equal to $V_{DD1}$ (save for any circuit and/or component non-ideal behavior). One selects the values of resistor 1210B and resistor 1215B (a) to obtain the desired switching speed and power dissipation of the memory cell; and (b) so that the common node between those two resistors provides the desired voltage division that corresponds to voltage $V_{out2}$.

One may select the voltage division ratio, x, of resistor 1210B and 1215B depending on the relative values of $V_{out1}$ and $V_{out2}$. More specifically, one chooses the values of the resistors $R_1$ and $R_2$ such that $$x = \frac{R_2}{R_1 + R_2}.$$

For example, to translate a 10V signal to a 2.5V signal, one would use a 4:1 voltage division ratio (x=¼). Note that one may apply a similar configuration to other circuitry within SiGe-based circuitry 212 (e.g., redundancy circuitry 115), as desired.

Depending on desired design and performance specifications for a particular implementation, one may use a variety of other voltage translators. For example, one may realize the current limiting function of load resistors $R_1$ and $R_2$ by using MOS transistors in which the drain terminal couples to the gate terminal.

By appropriately selecting the width-to-length (W/L) ratios of the series-coupled MOS transistors, one may provide the desired voltage translation, as persons skilled in the art with the benefit of the description of the invention understand. One transistor in the combination of the series-coupled transistors would correspond to resistor 1210B, whereas the other transistor would correspond to resistor 1215B. For a given channel length, L, $$x = \frac{W_2}{W_1 + W_2},$$

where $W_1$ and $W_2$ denote the respective widths of the two series-coupled transistors. One selects the threshold voltage of the load PMOS transistor to obtain the desired switching speed and power dissipation of the memory cell.

Figure 13:
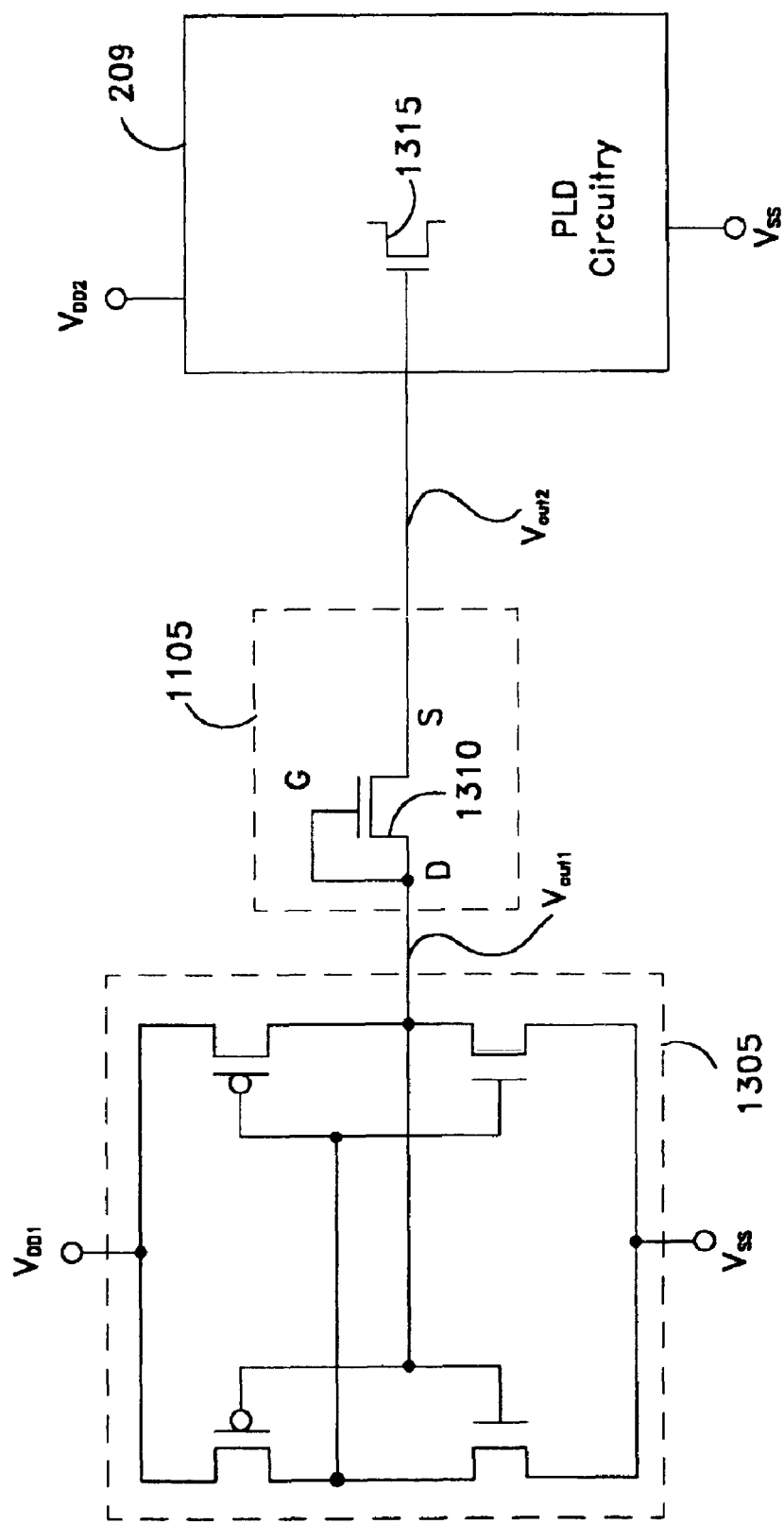
FIG. 13 shows a portion of another exemplary embodiment of a PLD according to the invention that includes voltage translation or level-shifting.

FIG. 13 illustrates a portion of another exemplary embodiment of a PLD according to the invention that includes voltage translation or level-shifting. The circuit in FIG. 13 includes SiGe-based CMOS SRAM cell 1305, for example, a cell in memory 106 (see FIG. 1). SRAM cell 1305 includes a pair of SiGe PMOS transistors and SiGe NMOS transistors arranged as cross-coupled inverters, and operates in a manner known to persons of ordinary skill in the art.

An output of SRAM cell 1305, denoted as $V_{out1}$, couples to voltage translator 1105. Voltage translator 1105 generates voltage $V_{out2}$, which it provides to transistor 1315 within silicon-based circuitry 209. Voltage translator 1105 includes SiGe transistor 1310. The drain of transistor 1310 couples to its gate (i.e., a diode-connected configuration), and accepts voltage $V_{out1}$ from SRAM cell 1105. The source of transistor 1310 drives the gate of transistor 1315.

Transistor 1315 may constitute a transistor within the PLD, for example, within programmable electronic circuitry 109 or programmable interconnect 112 (see FIG. 1). Note that, in order to increase the drive strength of transistor 1315, one may supply to the gate of transistor 1315 a voltage larger than $V_{DD2}$, the supply voltage of silicon-based circuitry, as desired. In other words, voltage translator 1310 has a voltage transfer ratio, f, such that $$V_{out2} = f \cdot V_{out1},$$

and $$V_{out2} \geq V_{DD2}.$$

One designs and fabricates transistor 1310 with a threshold voltage, $V_T$, such that $$V_T \leq V_{DD1} - V_{DD2}.$$

In other words, by selecting the threshold voltage of transistor 1310, one may control the gate voltage of transistor 1315 and, hence, its drive strength. Note that, rather than using voltage translator 1105 and transistor 1310 in connection with an SRAM cell, one may apply a similar configuration to other circuitry within SiGe-based circuitry 212 (e.g., redundancy circuitry 115), as desired.

Figure 14:
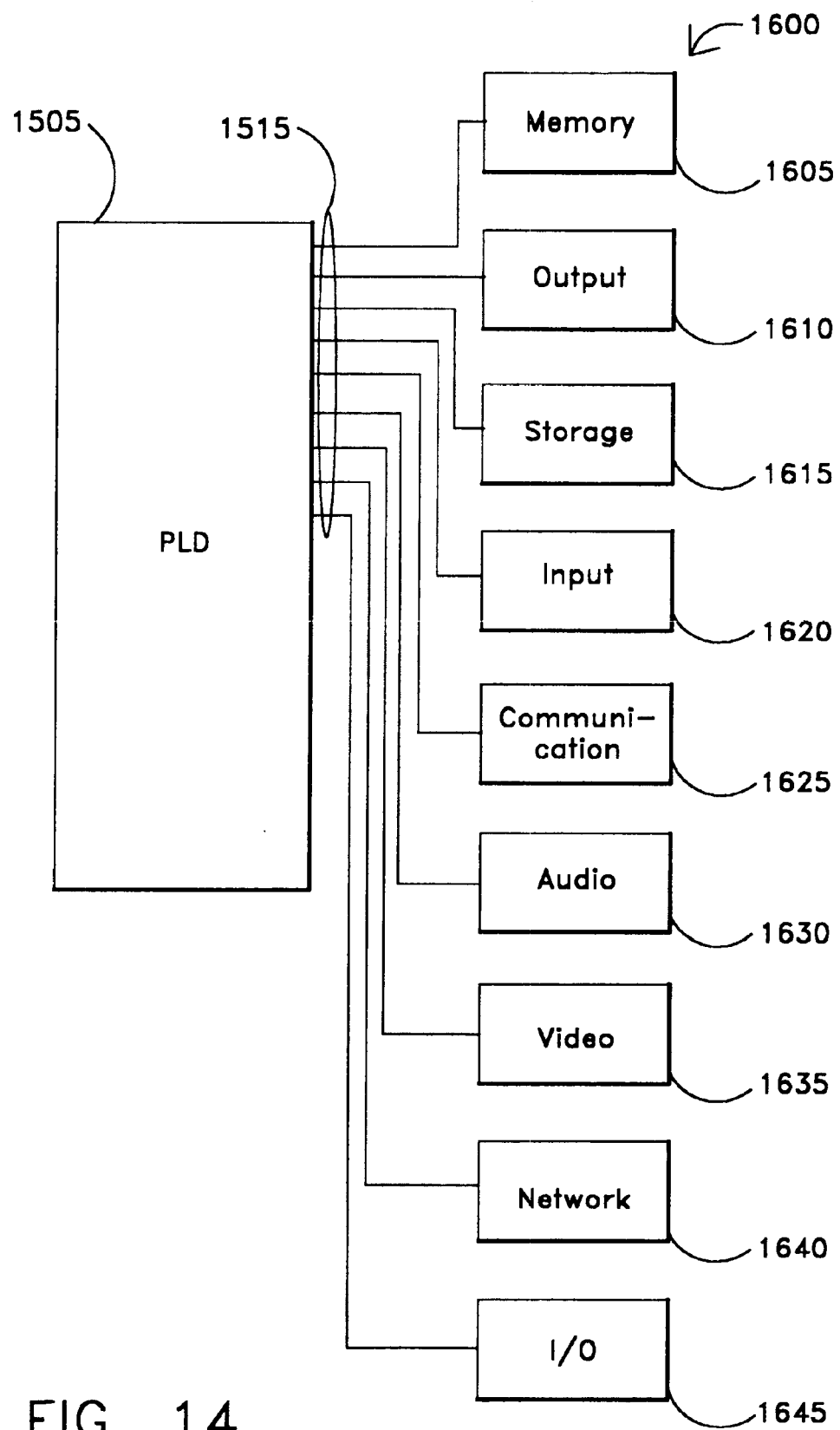
FIG. 14 illustrates an exemplary embodiment of a data-processing system that includes a PLD according to the invention.

One may use PLDs according to the invention, such as those shown and described above, in a variety of applications, such as data-processing applications. FIG. 14 shows an illustrative embodiment 1600 of a data-processing system that includes PLD 1505 according to the invention. Note that one may include more than one PLD 1505 in embodiment 1600, as desired.

PLD 1505 shown in FIG. 14 may include one or more of the circuitry and/or transistors described above. For example, PLD 1505 may be similar or the same as PLD 100 (see FIG. 1). Thus, PLD 1505 may include memory circuitry and redundancy circuitry (or, generally other circuitry not within the data path, or outside the data path, of PLD 1505) fabricated using SiGe-based circuitry, as well as other circuitry (such as programmable electronic circuitry and/or programmable interconnect) fabricated in silicon. PLD 1505 may also include one or more processors, as desired. Furthermore, various parts of PLD 1505, such as programmable interconnects, pass devices or transistors, look-up table circuits, processors, and/or logic gates or logic circuitry may couple together, as persons of ordinary skill in the art who have the benefit of the description of the invention understand.

Embodiment 1600 optionally includes a plurality of peripherals 1605–1645 that couple to PLD 1505 via a plurality of signal links 1515. Signal links 1515 may constitute any suitable signal lines or a collection of a plurality of signal lines (i.e., a plurality of signal lines coupled to each of peripherals 1605–1645, and the collection of the plurality of signal lines constituting signal links 1515). For example, signal links 1515 may constitute one or more buses or other communication and coupling mechanisms, as persons of ordinary skill in the art with the benefit of the description of the invention understand.

Peripherals 1605–1645 include one or more memory 1605 (e.g., SDRAM circuitry and associated controller), output circuitry 1610 (e.g., a printer), storage circuitry 1615 (e.g., a hard drive), input circuitry 1620 (e.g., a keyboard), communication circuitry 1625 (e.g., a modem), audio circuitry 1630 (e.g., sound card, speakers), video circuitry 1635 (e.g., a video controller, monitor, or both), network circuitry 1640 (e.g., an Ethernet controller or network interface card), and I/O circuitry 1645 (e.g., game controller or joystick). As persons skilled in the art recognize, however, one may use other peripheral devices and circuits, as desired. Furthermore, one may include more or fewer peripheral devices or circuits than shown, as desired. One may also couple one or more of peripherals 1605–1645 to PLD 1505 or other parts of the data-processing system through one or more interface circuits, as desired.

Referring to FIG. 14, PLD 1505 (and/or one or more of peripherals 1605–1645) may also include one or more processors, as desired. The processor or processors may couple (not shown explicitly) to various parts of PLD 1505 (such as the programmable interconnect, pass devices or transistors, look-up table circuits, and/or logic gates or logic circuitry) and/or peripherals 1605–1645. The processor or processors may operate on the data within the data-processing systems and decode and execute instructions. The processor or processors may couple to and/or communicate with peripherals 1605–1645, as desired. Note that more than one of peripherals 1605–1645 may couple to and/or communicate with a given processor, as desired. Note further that more than one processor may couple to and/or communicate with a given one of peripherals 1605–1645, as desired.

Generally, one may use PLD 1505 in a wide range and type of embodiments of data-processing systems, as persons skilled in the art with the benefit of the description of the invention understand. Embodiment 1600 illustrates merely one such embodiment. The choice of the architecture, configuration, and characteristics of data-processing systems that include one or more PLDs 1505 according to the invention depends on design and performance specification for a particular application, as persons of ordinary skill in the art understand.

Although PLD 1505 in FIG. 14 may include various circuitry according to the invention, such as SiGe-based memory or redundancy circuitry, one may use each of such circuits and devices alone in a given data-processing system, as desired. For example, one may use a data-processing system that includes a PLD that includes SiGe-based memory (but not redundancy circuitry) according to the invention. As another example, one may implement a data-processing system that uses a PLD with SiGe-based redundancy circuits (but not memory) according to the invention. Furthermore, one may combine one or more such devices in a PLD according to the invention. Generally, one may implement a data-processing system that uses one or more PLDs that each include circuitry outside the data path of the PLD integrated vertically with respect to the semiconductor (e.g., silicon) substrate of the PLD, as desired.

The circuitry in the embodiments described above may use either NMOS or PMOS configurations. Note, however, that rather than using a single type of transistor, one may use another type of transistor, as desired, by making modifications that fall within the knowledge of persons of ordinary skill in the art that have the benefit of the description of the invention. In addition, one may use a combination of NMOS and PMOS transistors in CMOS circuitry, as persons skilled in the art understand. Moreover, one may implement the various circuits as logic-high or logic-low, as desired, by making modifications that fall within the knowledge of persons skilled in the art with the benefit of the description of the invention. For example, one may replace NMOS transistors with PMOS transistors, and the like, with corresponding changes in the appropriate driver or control circuitry.

Exemplary embodiments described above use ranges of concentrations, thickness of layers, time periods, energy, dopant type, materials, dosage, and the like. Note that, depending on the design and performance specifications for a particular implementation and available fabrication technology, one may use other ranges or types of those quantities or materials, as desired. Furthermore, the processing steps and the order of the processing of the semiconductor materials in exemplary embodiments described above relate to present semiconductor fabrication and processing technologies. Persons of ordinary skill in the art with the benefit of the description of the invention understand that one may use variations of those processes or other processes that are currently available or become available in the future.

The illustrative embodiments of the invention described above refer to PLDs. Note, however, that one may apply the inventive concepts effectively to circuitry known by other names, such as complex programmable logic device (CPLD), programmable gate array (PGA), and field programmable gate array (FPGA), as desired.

Note that exemplary embodiments according to the invention, such as the embodiments described above and illustrated in the drawings, use SiGe-based circuitry that resides above the semiconductor (e.g., silicon) substrate of the PLD. Rather than using SiGe-based circuitry, however, one may fabricate using silicon the circuitry that resides above the semiconductor substrate of the PLD. In other words, one may use silicon-based circuitry deposited above the semiconductor substrate where some of the PLD logic circuitry resides. One may use the silicon-based circuitry to implement a memory used to program the PLD, redundancy circuitry or, generally, any other circuitry not within the data path of the PLD (outside the data path of the PLD).

Put another way, rather than integrating the memory, redundancy circuitry, or other circuitry within the semiconductor substrate, one may integrate such circuitry vertically with respect to the semiconductor substrate, i.e., in silicon-based circuitry disposed or fabricated above the semiconductor substrate. As with the SiGe-based variety, silicon-based circuitry fabricated in this manner solves the problems associated with conventional PLDs, described above (denser PLDs with larger equivalent gate counts, and more efficient use of interconnect resources). Furthermore, exemplary embodiments according to the invention use a silicon PLD substrate. As persons skilled in the art who have the benefit of the description of the invention understand, however, depending on design and performance specifications used, one may use other semiconductor substrates in alternative embodiments, as desired.

Referring to the figures, the various blocks shown (for example, FIG. 1) depict mainly the conceptual functions and signal flow. The actual circuit implementation may or may not contain separately identifiable hardware for the various functional blocks. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have read the disclosure of the invention will understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only.

The forms of the invention shown and described should be taken as the presently preferred embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

I claim:

1. A programmable logic device (PLD), comprising:
    programmable electronic circuitry fabricated in a silicon substrate; and
    memory circuitry coupled to the programmable electronic circuitry, the memory circuitry fabricated using silicon-germanium, wherein the memory circuitry is fabricated using a plurality of layers deposited above the silicon substrate, the plurality of layers comprising a first oxide layer deposited above the silicon substrate, a first seed layer of silicon deposited above the first oxide layer, and a first layer of silicon-germanium deposited above the first seed layer of silicon.

2. The programmable logic device (PLD) according to claim 1, further comprising programmable interconnect, the programmable interconnect configured to couple to the programmable electronic circuitry and to the memory circuitry.

3. The programmable logic device (PLD) according to claim 1, wherein the plurality of layers comprises a second oxide layer deposited above the first layer of silicon-germanium.

4. The programmable logic device (PLD) according to claim 3, wherein the plurality of layers further comprises a second seed layer of silicon-germanium deposited above the second oxide layer.

5. The programmable logic device (PLD) according to claim 4, wherein the plurality of layers further comprises a second layer of silicon-germanium deposited above the second seed layer of silicon.

6. The programmable logic device (PLD) according to claim 5, wherein the memory circuitry comprises a plurality of silicon-germanium-based devices fabricated by selectively etching at least the first and second layers of silicon-germanium, the second oxide layer, and the first seed layer of silicon.

7. The programmable logic device (PLD) according to claim 6, further comprising a first plurality of contacts configured to couple a first set of conductors formed in a metal layer fabricated above the second oxide layer to at least one of the first and second layers of silicon-germanium.

8. The programmable logic device (PLD) according to claim 7, further comprising a second plurality of contacts configured to couple a set of conductors formed in the metal layer to at least one of the programmable electronic circuitry and the programmable interconnect.

9. The programmable logic device (PLD) according to claim 8, further comprising redundancy circuitry fabricated using the plurality of layers.

10. The programmable logic device (PLD) according to claim 9, wherein the plurality of silicon-germanium devices comprises at least one P-type metal oxide semiconductor (PMOS) transistor, at least one N-type metal oxide semiconductor (NMOS) transistor, at least one resistor, or a combination thereof.

11. The programmable logic device (PLD) according to claim 10, further comprising a voltage translator circuit coupled to the memory circuitry and to one or more of the programmable electronic circuitry and the programmable interconnect.

12. The programmable logic device (PLD) according to claim 11, wherein the memory circuitry comprises static random-access memory (SRAM) circuitry.

13. The programmable logic device (PLD) according to claim 11, wherein the voltage translator circuit comprises a voltage divider.

14. The programmable logic device (PLD) according to claim 11, wherein the voltage translator circuit comprises a transistor.

15. A data-processing system, comprising:
a programmable logic device (PLD), comprising:
programmable logic circuitry configured to allow programming the functionality of the programmable logic device (PLD) in response to programming information, the programmable logic circuitry further configured to reside in a silicon substrate; and
memory circuitry fabricated using silicon-germanium-based circuitry, the memory circuitry configured to provide the programming information to the programmable logic circuitry, wherein the silicon-germanium-based circuitry comprises a first oxide layer deposited above the silicon substrate, a first seed layer of silicon deposited above the first oxide layer, and a first layer of silicon-germanium deposited above the first seed layer of silicon.

16. The data-processing system according to claim 15, wherein the programmable logic device further comprises a processor coupled to the programmable logic circuitry.

17. The data-processing system according to claim 16, further comprising at least one peripheral coupled to the programmable logic device.

18. The data-processing system according to claim 15, wherein the silicon-germanium-based circuitry further comprises a second oxide layer deposited above the first layer of silicon-germanium.

19. The data-processing system according to claim 18, wherein the silicon-germanium-based circuitry further comprises a second seed layer of silicon deposited above the second oxide layer.

20. The data-processing system according to claim 19, wherein the silicon-germanium-based circuitry further comprises a second layer of silicon-germanium deposited above the second seed layer of silicon.

21. The data-processing system according to claim 20, wherein the programmable logic device further comprises a processor coupled to the programmable logic circuitry.

22. The data-processing system according to claim 21, further comprising at least one peripheral coupled to the programmable logic device.

23. The data-processing system according to claim 20, wherein the programmable logic device further comprises redundancy circuitry fabricated using the silicon-germanium-based circuitry.

24. The data-processing system according to claim 23, wherein the silicon-germanium-based circuitry comprises a plurality of devices fabricated by selective etching of the second oxide layer, the second seed layer of silicon, and the first and second silicon-germanium layers.

25. The data-processing system according to claim 24, wherein the plurality of devices comprises at least one P-type metal oxide semiconductor (PMOS) transistor, at least one N-type metal oxide semiconductor (NMOS) transistor, at least one resistor, or a combination thereof.

26. The data-processing system according to claim 25, wherein the memory circuitry comprises static random-access memory (SRAM) circuitry.

27. The data-processing system according to claim 26, further comprising a voltage translator circuit coupled to the silicon-germanium-based circuitry and to at least one of the programmable logic circuitry and the programmable interconnect.

28. The data-processing system according to claim 27, further comprising at least one peripheral coupled to the programmable logic device.

29. The data-processing system according to claim 28, wherein the programmable logic device further comprises a processor coupled to the programmable logic circuitry.

30. The data-processing system according to claim 29, further comprising an interface circuit coupled between the at least one peripheral and the programmable logic device.

31. A programmable logic device (PLD), comprising:
a first block of circuitry within the programmable logic device, the first block of circuitry including programmable logic circuitry; and
a second block of circuitry outside the data path of the programmable logic device, the second block of circuitry coupled to the first block of circuitry,
wherein the second block of circuitry is fabricated using silicon-germanium, and wherein the programmable logic device (PLD) is configured to reside in a data-processing system, wherein the second block of circuitry is fabricated in a plurality of layers integrated vertically with respect to a silicon substrate that includes the first block of circuitry, the plurality of layers comprising a first dielectric layer is disposed above the silicon substrate, and a first seed layer of silicon deposited above the first dielectric layer.

32. The programmable logic device (PLD) according to claim 31, wherein the second block of circuitry comprises redundancy circuitry.

33. The programmable logic device (PLD) according to claim 31, wherein the plurality of layers further comprises a first layer of silicon-germanium deposited above the first seed layer of silicon.

34. The programmable logic device (PLD) according to claim 33, wherein the plurality of layers further comprises a second dielectric layer deposited above the first layer of silicon-germanium.

35. The programmable logic device (PLD) according to claim 34, wherein the plurality of layers further comprises a second seed layer of silicon deposited above the second dielectric layer.

36. The programmable logic device (PLD) according to claim 35, wherein the plurality of layers further comprises a second layer of silicon-germanium deposited above the second seed layer of silicon.

37. The programmable logic device (PLD) according to claim 36, wherein the silicon-germanium circuitry comprises a plurality of devices fabricated using at least the first silicon-germanium layer.

38. The programmable logic device (PLD) according to claim 37, wherein the first dielectric layer comprises a low-temperature oxide layer fabricated using a low-pressure chemical vapor deposition process or a low-pressure plasma-enhanced deposition process.

39. The programmable logic device (PLD) according to claim 38, wherein the first dielectric layer is planarized using a chemical mechanical polishing (CMP) process.

40. The programmable logic device (PLD) according to claim 37, wherein the first seed layer of silicon is fabricated at a temperature of about 400° C. to about 600° C. and has a thickness of about 10 Å to about 100 Å.

41. The programmable logic device (PLD) according to claim 37, wherein the first silicon-germanium layer is fabricated using low-pressure chemical vapor deposition or sputtering, and without breaking vacuum after fabricating the first seed layer of silicon.

42. The programmable logic device (PLD) according to claim 41, wherein the first silicon-germanium layer is fabricated at a temperature of about 400° C. to about 600° C. and has a thickness of about 0.05µ to about 0.5µ.

43. The programmable logic device (PLD) according to claim 42, wherein the first silicon-germanium layer is fabricated using a germanium concentration of about 0.1 to about 0.5.

44. The programmable logic device (PLD) according to claim 43, wherein the first silicon-germanium layer is doped with boron or phosphorous by implanting with doses in the range of about $10^{11}$/cm$^2$ to about $10^{14}$/cm$^2$.

45. The programmable logic device (PLD) according to claim 44, wherein the first silicon-germanium layer is annealed at a temperature of about 500° C. to about 800° C. for about 30 seconds to about 24 hours, or by using a rapid thermal anneal (RTA) process.

46. The programmable logic device (PLD) according to claim 37, wherein the second dielectric layer comprises a low-temperature oxide layer fabricated using a low-pressure chemical vapor deposition process or a low-pressure plasma-enhanced deposition process.

47. The programmable logic device (PLD) according to claim 46, wherein the second dielectric layer has a thickness of about 10 nm to about 1000 nm.

48. The programmable logic device (PLD) according to claim 37, wherein the second seed layer of silicon is fabricated at a temperature of about 400° C. to about 600° C. and has a thickness of about 10 Å to about 100 Å.

49. The programmable logic device (PLD) according to claim 37, wherein the second silicon-germanium layer is fabricated using low-pressure chemical vapor deposition or sputtering, and without breaking vacuum after fabricating the second seed layer of silicon.

50. The programmable logic device (PLD) according to claim 49, wherein the second silicon-germanium layer is fabricated at a temperature of about 400° C. to about 600° C. and has a thickness of about 0.1µ to about 0.5µ.

51. The programmable logic device (PLD) according to claim 50, wherein the second silicon-germanium layer is fabricated using a germanium concentration of about 0.2 to about 0.6.

52. The programmable logic device (PLD) according to claim 51, wherein the second silicon-germanium layer is implanted with boron at a dose of about $10^{14}$/cm$^2$ to about $5 \times 10^{16}$/cm$^2$.

53. The programmable logic device (PLD) according to claim 52, wherein the second silicon-germanium layer is annealed at a temperature of about 500° C. to about 600° C. for about 30 seconds to about 24 hours, or by using a rapid thermal anneal (RTA) process.

54. The programmable logic device (PLD) according to claim 37, wherein the first silicon-germanium layer comprises polycrystalline silicon-germanium.

55. The programmable logic device (PLD) according to claim 37, wherein the second silicon-germanium layer comprises polycrystalline silicon-germanium.

56. The programmable logic device (PLD) according to claim 37, further comprising:
 a third dielectric layer fabricated above the second silicon-germanium layer;
 a metal layer fabricated above the third dielectric layer; and
 a first set of one or more contacts coupled to the metal layer and to the second block of circuitry.

57. The programmable logic device (PLD) according to claim 56, further comprising a second set of one or more contacts coupled to the first block of circuitry and to the second block of circuitry.

58. The programmable logic device (PLD) according to claim 37, wherein the second set of one or more contacts includes at least one contact comprising titanium nitride, tungsten, or nitrides of tantalum.

59. The programmable logic device (PLD) according to claim 58, wherein the at least one contact in the second set of contacts is capped with titanium nitride.

60. The programmable logic device (PLD) according to claim 37, further comprising:
 a third dielectric layer fabricated above the second silicon-germanium layer;
 a metal layer fabricated above the third dielectric layer; and
 at least one contact coupled to the metal layer and to the first block of circuitry.

61. A method of fabricating a programmable logic device (PLD), comprising:
 fabricating a programmable electronic circuit in a silicon substrate;

fabricating a memory circuit using silicon-germanium, wherein the memory circuit couples to the programmable electronic circuit;

fabricating programmable interconnect within the PLD; and coupling the programmable interconnect to at least one of the programmable electronic circuitry and the memory circuitry, wherein fabricating the memory circuitry further comprises:
depositing a first oxide layer above the silicon substrate;
depositing a first seed layer of silicon above the first oxide layer; and
depositing a first layer of silicon-germanium above the first seed layer of silicon.

62. The method according to claim 61, wherein fabricating the memory circuitry further comprises depositing a second oxide layer above the first layer of silicon-germanium.

63. The method according to claim 62, wherein fabricating the memory circuitry further comprises depositing a second seed layer of silicon above the second oxide layer.

64. The method according to claim 63, wherein fabricating the memory circuitry further comprises depositing a second layer of silicon-germanium above the second seed layer of silicon.

65. The method according to claim 64, wherein fabricating the memory circuitry further comprises fabricating a plurality of silicon-germanium devices fabricated by selectively etching at least the first and second layers of silicon-germanium, the second oxide layer, and the first seed layer of silicon.

66. The method according to claim 65, further comprising fabricating a first plurality of contacts configured to couple a first set of conductors formed in a metal layer fabricated above the second oxide layer to at least one of the first and second layers of silicon-germanium.

67. The method according to claim 66, further comprising fabricating a second plurality of contacts configured to couple a set of conductors formed in the metal layer to at least one of the programmable electronic circuitry and the programmable interconnect.

68. The method according to claim 67, further comprising fabricating redundancy circuitry within the PLD by selectively etching at least one of the first and second oxide layers, the first and second seed layers of silicon, and the first and second layers of silicon-germanium.

69. The method according to claim 68, wherein fabricating the plurality of silicon-germanium devices comprises fabricating at least one P-type metal oxide semiconductor (PMOS) transistor, at least one N-type metal oxide semiconductor (NMOS) transistor, at least one resistor, or a combination thereof.

70. The method according to claim 69, further comprising fabricating within the PLD a voltage translator circuit, wherein the voltage translator circuit couples to the memory circuitry and to one or more of the programmable electronic circuitry and the programmable interconnect.

71. The method according to claim 70, wherein fabricating the memory circuitry further comprises fabricating static random-access memory (SRAM) circuitry.

72. The method according to claim 70, wherein fabricating the voltage translator circuit further comprises fabricating a voltage divider.

73. The method according to claim 70, wherein fabricating the voltage translator circuit further comprises fabricating a transistor.

74. A method of fabricating a programmable logic device (PLD), comprising:

fabricating a first block of circuitry within the programmable logic device, the first block of circuitry including programmable logic circuitry, the first block of circuitry in a silicon substrate;

fabricating a second block of circuitry outside the data path of the programmable logic device, the second block of circuitry coupled to the first block of circuitry, the second block of circuitry by integrating the second block of cicuitry vertically with respect to the silicon substrate, wherein the second block of circuitry is fabricated using silicon-germanium, and wherein the programmable logic device (PLD) is configured to reside in a data-processing system;

wherein fabricating the second block of circuitry further comprises fabricating a first dielectric layer above the silicon substrate; fabricating a first seed layer of silicon above the first dielectric layer; and fabricating a first layer of silicon-germanium above the first seed layer of silicon.

75. The method according to claim 74, wherein fabricating the second block of circuitry comprises including redundancy circuitry within the second block of circuitry.

76. The method according to claim 74, wherein fabricating the second block of circuitry further comprises including within the second block of circuitry at least one P-type metal oxide semiconductor (PMOS) transistor, at least one N-type metal oxide semiconductor (NMOS) transistor, at least one resistor, or a combination thereof.

77. The method according to claim 74, wherein fabricating the second block of circuitry further comprises fabricating a second dielectric layer above the first layer of silicon-germanium.

78. The method according to claim 77, wherein fabricating the second block of circuitry further comprises fabricating a second seed layer of silicon above the second dielectric layer.

79. The method according to claim 78, wherein fabricating the second block of circuitry further comprises fabricating a second layer of silicon-germanium above the second seed layer of silicon.

80. The method according to claim 79, wherein the at least one P-type metal oxide semiconductor (PMOS) transistor, at least one N-type metal oxide semiconductor (NMOS) transistor, at least one resistor, or a combination thereof is fabricated using at least the first silicon-germanium layer.

81. The method according to claim 80, wherein fabricating the first dielectric layer comprises depositing a low-temperature oxide layer by using a low-pressure chemical vapor deposition process or a low-pressure plasma-enhanced deposition process.

82. The method according to claim 81, wherein fabricating the first dielectric layer further comprises planarizing the first dielectric layer using a chemical mechanical polishing (CMP) process.

83. The method according to claim 80, wherein fabricating the first seed layer of silicon further comprises depositing the first seed layer of silicon at a temperature of about 400° C. to about 600° C. and to a thickness of about 10 Å to about 100 Å.

84. The method according to claim 80, wherein fabricating the first silicon-germanium layer further comprises using low-pressure chemical vapor deposition or sputtering, without breaking vacuum after fabricating the first seed layer of silicon.

85. The method according to claim 84, wherein fabricating the first silicon-germanium layer further comprises depositing silicon-germanium at a temperature of about 400° C. to about 600° C. to a thickness of about 0.05μ to about 0.5μ.

86. The method according to claim 85, wherein fabricating the first silicon-germanium layer further comprises using a germanium concentration of about 0.1 to about 0.5.

87. The method according to claim 86, wherein fabricating the first silicon-germanium layer further comprises implanting the silicon-germanium with boron or phosphorous by using implant doses in the range of about $10^{11}/cm^2$ to about $10^{14}/cm^2$.

88. The method according to claim 87, wherein fabricating the first silicon-germanium layer further comprises annealing the silicon-germanium at a temperature of about 500° C. to about 800° C. for about 30 seconds to about 24 hours, or by using a rapid thermal anneal (RTA) process.

89. The method according to claim 80, wherein fabricating the second dielectric layer further comprises depositing a low-temperature oxide layer fabricated using a low-pressure chemical vapor deposition process or a low-pressure plasma-enhanced deposition process.

90. The method according to claim 89, wherein fabricating the second dielectric layer further comprises fabricating the second dielectric layer with a thickness of about 10 nm to about 1000 nm.

91. The method according to claim 80, wherein fabricating the second seed layer of silicon further comprises using a temperature of about 400° C. to about 600° C. to deposit a layer of silicon with a thickness of about 10 Å to about 100 Å.

92. The method according to claim 80, wherein fabricating the second silicon-germanium layer further comprises using low-pressure chemical vapor deposition or sputtering, without breaking vacuum after fabricating the second seed layer of silicon.

93. The method according to claim 92, wherein fabricating the second silicon-germanium layer further comprises depositing silicon-germanium at a temperature of about 400° C. to about 600° C. to a thickness of about 0.1μ to about 0.5μ.

94. The method according to claim 93, wherein fabricating the second silicon-germanium layer further comprises using a germanium concentration of about 0.2 to about 0.6.

95. The method according to claim 94, wherein fabricating the first silicon-germanium layer further comprises implanting the silicon-germanium with boron at a dose of about $10^{14}/cm^2$ to about $5 \times 10^{16}/cm^2$.

96. The method according to claim 95, wherein the second silicon-germanium layer is annealed at a temperature of about 500° C. to about 600° C. for about 30 seconds to about 24 hours, or by using a rapid thermal anneal (RTA) process.

97. The method according to claim 80, wherein the first silicon-germanium layer comprises polycrystalline silicon-germanium.

98. The method according to claim 80, wherein the second silicon-germanium layer comprises polycrystalline silicon-germanium.

99. The method according to claim 80, further comprising:
fabricating a third dielectric layer above the second silicon-germanium layer;
fabricating a metal layer above the third dielectric layer; and
coupling the metal layer and to the second block of circuitry by forming a first set of one or more contacts.

100. The method according to claim 99, further comprising coupling the first block of circuitry and to the second block of circuitry by forming a second set of one or more contacts.

101. The method according to claim 80, wherein forming the second set of one or more contacts includes fabricating at least one contact that comprises titanium nitride, tungsten, or nitrides of tantalum.

102. The method according to claim 101, wherein the at least one contact in the second set of contacts is capped with titanium nitride.

103. The method according to claim 80, further comprising:
fabricating a third dielectric layer above the second silicon-germanium layer;
fabricating a metal layer fabricated above the third dielectric layer; and
coupling the metal layer to the first block of circuitry by forming at least one contact.

* * * * *